(12) United States Patent
Kim

(10) Patent No.: US 9,653,168 B2
(45) Date of Patent: May 16, 2017

(54) NONVOLATILE MEMORY DEVICE AND A METHOD OF OPERATING THE NONVOLATILE MEMORY DEVICE

(71) Applicant: SAMSUNG ELECTRONICS CO., LTD., Suwon-si, Gyeonggi-Do (KR)

(72) Inventor: Wandong Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/010,529

(22) Filed: Jan. 29, 2016

(65) Prior Publication Data
US 2016/0225454 A1   Aug. 4, 2016

(30) Foreign Application Priority Data

Feb. 3, 2015   (KR) .......................... 10-2015-0016714

(51) Int. Cl.
| G11C 16/04 | (2006.01) |
| G11C 16/10 | (2006.01) |
| G11C 16/34 | (2006.01) |
| G11C 16/08 | (2006.01) |

(52) U.S. Cl.
CPC .......... *G11C 16/10* (2013.01); *G11C 16/0483* (2013.01); *G11C 16/08* (2013.01); *G11C 16/3459* (2013.01); *G11C 16/3418* (2013.01)

(58) Field of Classification Search
CPC .. G11C 16/10; G11C 16/3459; G11C 16/0483
See application file for complete search history.

(56) References Cited

U.S. PATENT DOCUMENTS

| 7,646,646 B2 | 1/2010 | Hosomura et al. |
| 7,652,929 B2 | 1/2010 | Li |
| 7,679,133 B2 | 3/2010 | Son et al. |
| 7,804,712 B2 | 9/2010 | Kim et al. |
| 8,233,327 B2 | 7/2012 | Wang |
| 8,374,031 B2 | 2/2013 | Yuh |
| 8,411,503 B2 | 4/2013 | Lee |
| 8,553,466 B2 | 10/2013 | Han et al. |
| 8,559,235 B2 | 10/2013 | Yoon et al. |
| 8,634,251 B2 | 1/2014 | Chung |
| 8,654,587 B2 | 2/2014 | Yoon et al. |
| 8,913,427 B2 | 12/2014 | Huh |
| 2010/0067305 A1* | 3/2010 | Park ..................... G11C 16/12 365/185.19 |
| 2011/0233648 A1 | 9/2011 | Seol et al. |

(Continued)

FOREIGN PATENT DOCUMENTS

| JP | 2006-331476 | 12/2006 |
| KR | 1020070052403 | 5/2007 |
| KR | 1020120061560 | 6/2012 |

*Primary Examiner* — Toan Le
(74) *Attorney, Agent, or Firm* — F. Chau & Associates, LLC

(57) ABSTRACT

A method of programming a nonvolatile memory device includes: applying a first voltage to a first wordline of the nonvolatile memory device; and applying a second voltage to a second wordline of the nonvolatile memory device, wherein the second voltage is greater than the first voltage; decreasing the first voltage; decreasing the second voltage, wherein a difference between the first voltage and the second voltage is maintained for a predetermined time; and discharging the second voltage.

24 Claims, 20 Drawing Sheets

(56) References Cited

U.S. PATENT DOCUMENTS

| | | | | |
|---|---|---|---|---|
| 2012/0170371 A1* | 7/2012 | Aritome | ............ | G11C 16/0483 |
| | | | | 365/185.18 |
| 2015/0003163 A1* | 1/2015 | Shirota | ................. | G11C 16/10 |
| | | | | 365/185.17 |
| 2015/0117108 A1* | 4/2015 | Shim | ................. | G11C 16/3418 |
| | | | | 365/185.18 |
| 2016/0064083 A1* | 3/2016 | Nam | ..................... | G11C 16/10 |
| | | | | 365/185.11 |

* cited by examiner

FIG. 18

|     | Initial VD | Increment of VD | Initial THT | Increment of THT |
|-----|------------|-----------------|-------------|------------------|
| WL6 | VD6        | VDI6            | THT6        | THT16            |
| WL5 | VD5        | VDI5            | THT5        | THT15            |
| WL4 | VD4        | VDI4            | THT4        | THT14            |
| WL3 | VD3        | VDI3            | THT3        | THT13            |
| WL2 | VD2        | VDI2            | THT2        | THT12            |
| WL1 | VD1        | VDI1            | THT1        | THT11            |

FIG. 19

|     | Initial VD | Increment of VD | Initial THT | Increment of THT |
|-----|------------|-----------------|-------------|------------------|
| WL6 | VD3        | VDI3            | THT3        | THT13            |
| WL5 |            |                 |             |                  |
| WL4 | VD2        | VDI2            | THT2        | THT12            |
| WL3 |            |                 |             |                  |
| WL2 | VD1        | VDI1            | THT1        | THT11            |
| WL1 |            |                 |             |                  |

NONVOLATILE MEMORY DEVICE AND A METHOD OF OPERATING THE NONVOLATILE MEMORY DEVICE

CROSS-REFERENCE TO RELATED APPLICATION

This application claims priority under 35 U.S.C. §119 to Korean Patent Application No. 10-2015-0016714 filed Feb. 3, 2015, in the Korean Intellectual Property Office, the disclosure of which is incorporated by reference herein in its entirety.

TECHNICAL FIELD

Exemplary embodiments of the inventive concept relate to a semiconductor memory, and more particularly, to a nonvolatile memory device and an operating method thereof.

DISCUSSION OF RELATED ART

A storage device may store data responsive to a control of a host device, such as a computer, a smart phone, or a smart pad. The storage device may include a hard disk drive which stores data on a magnetic disk, or a semiconductor memory which stores data on a nonvolatile memory. The semiconductor memory may be a solid state drive (SSD) or a memory card.

A nonvolatile memory may include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), or the like.

SUMMARY

In accordance with an exemplary embodiment of the inventive concept, a method of programming a nonvolatile memory device comprises: applying a first voltage to a first wordline of the nonvolatile memory device; and applying a second voltage to a second wordline of the nonvolatile memory device, wherein the second voltage is greater than the first voltage; decreasing the first voltage; decreasing the second voltage, wherein a difference between the first voltage and the second voltage is maintained for a predetermined time; and discharging the second voltage.

The first voltage may be a pass voltage and the second voltage may be a program voltage.

The first wordline may be an unselected wordline, and the second wordline may be a selected wordline.

The first voltage may start being decreased after the second voltage starts being decreased.

The second voltage may stop being decreased before the first voltage starts being decreased.

Decreasing the second voltage may comprise decreasing the second voltage to a first level, and then, decreasing the second voltage to a second level lower than the first level.

Decreasing the first voltage may comprise decreasing the first voltage to a first level, and then, decreasing the first voltage to a second level lower than the first level.

A program operation may comprise the steps of applying the first voltage, applying the second voltage, decreasing the first voltage, decreasing the second voltage and discharging the second voltage, the method may further comprise: performing a verification operation of the program operation; determining whether the verification operation passes or fails; and repeating the program operation when the verification operation fails, wherein, in repeating the program operation, the difference between the first voltage and the second voltage is changed, or wherein, in repeating the program operation, the predetermined time is changed.

In repeating the program operation, the difference between the first voltage and the second voltage may be increased, or in repeating the program operation, the predetermined time may be increased.

A program operation may comprise the steps of applying the first voltage, applying the second voltage, decreasing the first voltage, decreasing the second voltage and discharging the second voltage, wherein the program operation is performed after a target program state of a plurality of program states is program passed.

The difference between the first voltage and the second voltage may depend on a location of the second wordline in a cell string, or the predetermined time may depend on the location of the second wordline in the cell string.

The difference between the first voltage and the second voltage may depend on a wordline group in which the second wordline is located in a cell string, or the predetermined time may depend on the wordline group in which the second wordline is located in the cell string.

The nonvolatile memory device may include a cell string, the cell string including a plurality of memory cells, a first memory cell being connected to the first wordline and receiving the first voltage, a second memory cell being connected to the second wordline and receiving the second voltage.

The first and second memory cells may be charge trap cells.

In accordance with an exemplary embodiment of the inventive concept, a method of programming a nonvolatile memory device may comprise: applying a first voltage to a first wordline of the nonvolatile memory device; and applying a second voltage to a second wordline of the nonvolatile memory device, wherein the second voltage is greater than the first voltage; decreasing the first voltage; decreasing the second voltage, wherein the second voltage is higher than the first voltage for a predetermined time; and discharging the second voltage after the predetermined time.

The first voltage may be a pass voltage, and the second voltage may be a program voltage.

The predetermined time may be about 10 μs.

The nonvolatile memory device may include a cell string, the cell string including a plurality of memory cells, a first memory cell being connected to the first wordline and receiving the first voltage, a second memory cell being connected to the second wordline and receiving the second voltage.

The first and second memory cells may be charge trap cells.

In accordance with an exemplary embodiment of the inventive concept, a method for programming a NAND flash memory including a memory cell array, the memory cell array including a plurality of memory blocks, each block including a plurality of cell strings, each cell sting including a ground selection transistor, a plurality of cell transistors, and a string selection transistor sequentially stacked in a direction perpendicular to a surface of a substrate on which the cell string is disposed, comprises: applying a first voltage to a first wordline of a cell string, wherein the first voltage has a first level; applying a second voltage to a second wordline of the cell string, wherein the second voltage has a second level, wherein the second level is greater than the first level; decreasing the first voltage to a third level, wherein the third level is less than the first level; decreasing the second voltage to a fourth level, wherein the fourth level is less than the second level and greater than the third level, wherein a difference between the third level and the fourth level is constant for a predetermined time; and discharging the second voltage to the third level.

The cell transistors may be charge trap transistors.

The first voltage may be a pass voltage, and the second voltage may be a program voltage.

The third level may have a range from 0V to 1.5V.

The method may further comprise: applying a select voltage to a bitline of the cell string.

BRIEF DESCRIPTION OF THE FIGURES

The above and other features of the inventive concept will become more apparent by describing in detail exemplary embodiments thereof with reference to the following figures, in which:

FIG. 18 is a diagram for describing how voltage differences and holding times of word lines are adjusted, according to an exemplary embodiment of the inventive concept;

FIG. 19 is a diagram for describing how voltage differences and holding times of word lines are adjusted, according to an exemplary embodiment of the inventive concept;

DETAILED DESCRIPTION OF THE EMBODIMENTS

Figure 1:
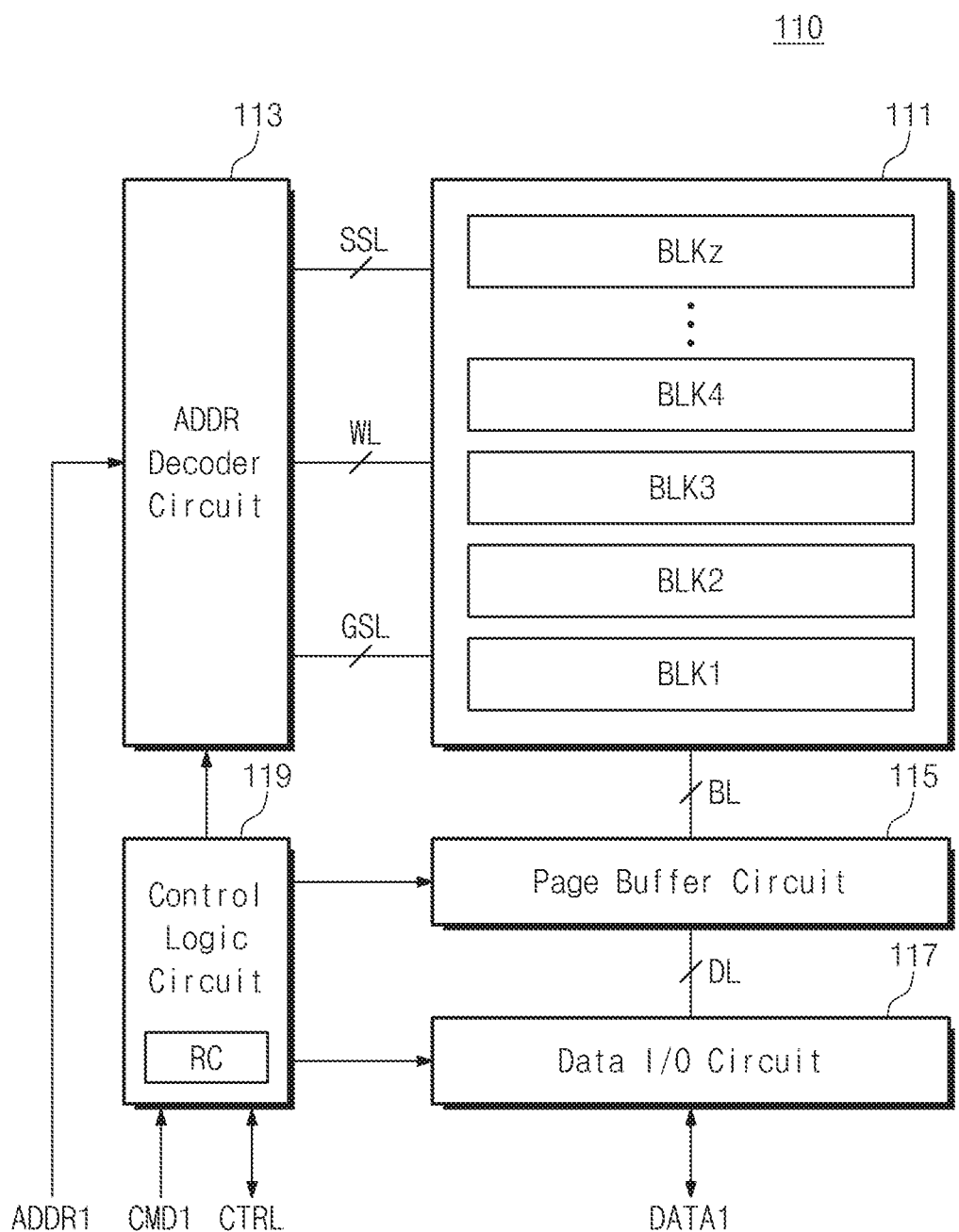
FIG. 1 is a block diagram illustrating a nonvolatile memory according to an exemplary embodiment of the inventive concept.

The inventive concept will now be described more fully hereinafter with reference to the accompanying drawings, in which exemplary embodiments thereof are shown. The inventive concept, however, may be embodied in various different forms, and should not be construed as being limited only to the illustrated embodiments. Unless otherwise noted, like reference numerals denote like elements throughout the attached drawings and written description, and thus descriptions may not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a nonvolatile memory 110 according to an exemplary embodiment of the inventive concept. Referring to FIG. 1, the nonvolatile memory 110 may include a memory cell array 111, an address decoder circuit 113, a page buffer circuit 115, a data input/output circuit 117, and a control logic circuit 119.

The memory cell array 111 may include a plurality of memory blocks BLK1 through BLKz, each of which has a plurality of memory cells. Each memory block may be connected to the address decoder circuit 113 through at least one string selection line SSL, a plurality of word lines WL, and at least one ground selection line GSL. Each memory block may be connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure. In an exemplary embodiment of the inventive concept, each of the memory blocks BLK1 through BLKz may be referred to as an erase unit. An erase operation may be carried out by the memory block. Memory cells of a memory block may be erased at the same time. In an exemplary embodiment of the inventive concept, each sub memory block may be divided into a plurality of sub blocks. Each sub block may be referred to as an erase unit.

The address decoder circuit 113 may be connected to the memory cell array 111 through a plurality of ground selection lines GSL, the plurality of word lines WL, and a plurality of string selection lines SSL. The address decoder circuit 113 may operate in response to a control of the control logic circuit 119. The address decoder circuit 113 may receive a first address ADDR1 from a memory controller (refer to FIG. 22). The address decoder circuit 113 may decode the first address ADDR1 and may control voltages to be applied to the word lines WL according to the decoded address.

For example, in a program operation, the address decoder circuit 113 may apply a program voltage to a selected word line of a selected memory block that the first address ADDR1 identifies. The address decoder circuit 113 may also apply a pass voltage to unselected word lines of the selected memory block. In a read operation, the address decoder circuit 113 may apply a selection read voltage to a selected word line of a selected memory block that the first address ADDR1 identifies. The address decoder circuit 113 may also apply a non-selection read voltage to unselected word lines of the selected memory block. In an erase operation, the address decoder circuit 113 may apply an erase voltage (e.g., a ground voltage or low voltages that have a level similar to that of the ground voltage) to word lines of a selected memory block that the first address ADDR1 identifies.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to a control of the control logic circuit 119.

The page buffer circuit 115 may hold data to be programmed in memory cells of the memory cell array 111 or data read from memory cells of the memory cell array 111. During a program operation, the page buffer circuit 115 may store data to be stored in memory cells. The page buffer circuit 115 may bias the plurality of bit lines BL based on the stored data. The page buffer circuit 115 may serve as a write driver in a program operation. During a read operation, the page buffer circuit 115 may sense voltages of the bit lines BL and may store the sensed results. The page buffer circuit 115 may serve as a sense amplifier in a read operation.

The data input/output circuit 117 may be connected to the page buffer circuit 115 through the data lines DL. The data input/output circuit 117 may exchange first data DATA1 with the memory controller.

The data input/output circuit 117 may temporarily store first data DATA1 that the memory controller provides, and the data input/output circuit 117 may transfer the temporarily stored data to the page buffer circuit 115. The data input/output circuit 117 may temporarily store data transferred from the page buffer circuit 115 and may transfer the temporarily stored data to the memory controller. The data input/output circuit 117 may serve as a buffer memory.

The control logic circuit 119 may receive a first command CMD1 and a control signal CTRL from an integrated circuit (IC). The control logic circuit 119 may decode the first command CMD1 and may control an overall operation of the nonvolatile memory 110 based on the decoded command.

In an exemplary embodiment of the inventive concept, during a read operation, the control logic circuit 119 may generate a data strobe signal DQS according to a read enable signal /RE of the received control signal CTRL. During a write operation, the control logic circuit 119 may generate a data strobe signal DQS according to a data strobe signal DQS of the received control signal CTRL.

The control logic circuit 119 may include a recovery control circuit (RC). In a recovery operation, the recovery control circuit RC may control voltages of word lines WL. The recovery operation may be an operation in which voltages of the word lines WL are discharged after specific voltages are applied to the word lines WL. For example, the recovery control circuit RC may control a program recovery operation (or a read recovery operation). In other words, after voltages are applied to the word lines WL in a program operation (or a read operation), the recovery control circuit RC may discharge voltages of the word lines WL. For example, the recovery control circuit RC may control a recovery operation by controlling voltages to be supplied to the word lines WL through the address decoder circuit 113.

Figure 2:
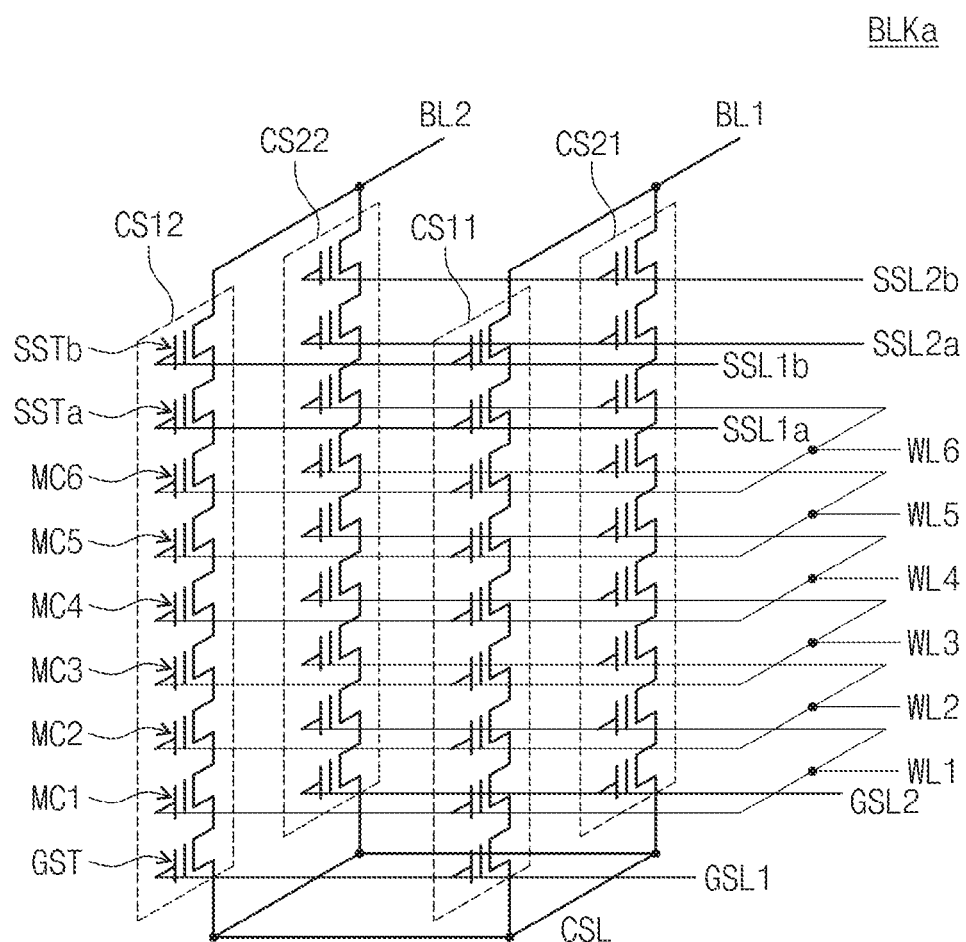
FIG. 2 is a circuit diagram illustrating a memory block according to an exemplary embodiment of the inventive concept.
Figure 2:
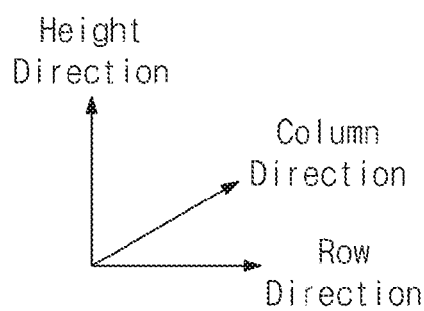

FIG. 2 is a circuit diagram illustrating a memory block BLKa according to an exemplary embodiment of the inventive concept. Referring to FIG. 2, the memory block BLKa may include a plurality of cell strings CS11 to CS21 and CS12 to CS22. The plurality of cell strings CS11 to CS21 and CS12 to CS22 may be arranged in a row direction and a column direction and may form rows and columns.

For example, the cell strings CS11 and CS12 arranged in the row direction may form a first row, and the cell strings CS21 and CS22 arranged in the row direction may form a second row. The cell strings CS11 and CS21 arranged in the column direction may form a first column, and the cell strings CS12 and CS22 arranged in the column direction may form a second column.

Each cell string CS11, CS21, CS12 and CS22 may contain a plurality of cell transistors. The cell transistors may include ground selection transistors GSTa and GSTb (e.g., GST), memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., a plane corresponding to a surface of a substrate on which the memory block BLKa is formed) on which the cell strings CS11 through CS21 and CS12 through CS22 are arranged in rows and columns.

Each cell transistor may be formed of a charge trap type cell transistor which has a threshold voltage that varies with an amount of charge trapped in its insulation layer.

Lowermost ground selection transistors GSTa may be connected in common to a common source line CSL.

In an exemplary embodiment of the inventive concept, ground selection transistors of the cell strings CS11 to CS21 and CS12 to CS22 may be connected to ground selection lines GSL1 and GSL2. For example, the ground selection transistors in the same row may be connected to the same ground selection line, and the ground selection transistors in different rows may be connected to different ground selection lines. For example, ground selection transistors GST of the cell strings CS11 and CS12 in a first row may be connected to a first ground selection line GSL1, and ground selection transistors GST of the cell strings CS21 and CS22 in a second row may be connected to a second ground selection line GSL2.

Connected in common to a word line are memory cells that are placed at the same height (or order) from the substrate (or the ground selection transistors GST). Connected to different word lines WL1 through WL6 are memory cells that are placed at different heights (or orders). For example, the memory cells MC1 may be connected in common to the word line WL1, the memory cells MC2 may be connected in common to the word line WL2, and the memory cells MC3 may be connected in common to the word line WL3. The memory cells MC4 may be connected in common to the word line WL4, the memory cells MC5 may be connected in common to the word line WL5, and the memory cells MC6 may be connected in common to the word line WL6.

Of the first string selection transistors SSTa, of the cell strings CS11 to CS21 and CS12 to CS22, the first string selection transistors SSTa in different rows may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a. The first string transistors SSTa of the cell strings CS11 to CS21 and CS12 to CS22 may have the same height (or order) from the substrate.

Of the second string selection transistors SSTb, of the cell strings CS11 to CS21 and CS12 to CS22, the second string selection transistors SSTb in different rows may be connected to the different string selection lines SSL1b and SSL2b. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b. The second string transistors SSTb of the cell strings CS11 to CS21 and CS12 to CS22 may have the same height (or order) from the substrate.

In other words, cell strings in different rows may be connected to different string selection lines. String selection transistors, having the same height (or order), of cell strings in the same row may be connected to the same string selection line. String selection transistors, having different heights (or orders), of cell strings in the same row may be connected to different string selection lines.

In an exemplary embodiment of the inventive concept, string selection transistors of cell strings in the same row may be connected in common to a string selection line. For example, string selection transistors SSTa and SSTb of cell strings CS11 and CS12 in the first row may be connected in common to a string selection line, and string selection transistors SSTa and SSTb of cell strings CS21 and CS22 in the second row may be connected in common to a string selection line.

Columns of the cell strings CS11 to CS21 and CS12 to CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The cell strings CS11 and CS12 may form a first plane, and the cell strings CS21 and CS22 may form a second plane.

In the memory block BLKa, memory cells in each plane having the same height may form a physical page. The physical page may be a write/read unit of the memory cells MC1 to MC6. A plane of the memory block BLKa may be selected, for example, by the string selection lines SSL1a, SSL1b, SSL2a, and SSL2b. Connected to the bit lines BL1 and BL2 are the cell strings CS11 and CS12 of the first plane when a turn-on voltage is applied to the string selection lines SSL1a and SSL1b and a turn-off voltage is supplied to the string selection lines SSL2a and SSL2b. In other words, the first plane is selected. Connected to the bit lines BL1 and BL2 are the cell strings CS21 and CS22 of the second plane when a turn-on voltage is applied to the string selection lines SSL2a and SSL2b and a turn-off voltage is supplied to the string selection lines SSL1a and SSL1b. In other words, the second plane is selected. In a selected plane, a row of memory cells may be selected by the word lines WL1 to WL6. In a selected row, a selection voltage may be applied to the second word line WL2, and a non-selection voltage may be applied to the remaining word lines WL1 and WL3 to WL6. A physical page corresponding to the second word line WL2 in the second plane may be selected by adjusting voltages of the string selection lines SSL1a, SSL1b, SSL2a, and SSL2b and the word lines WL1 to WL6. A write or read operation may be performed with respect to memory cells MC2 in a selected physical page.

An erase operation on the memory block BLKa may be performed by the block or by the sub block. All of the memory cells of the memory block BLKa may be erased based on an erase request (e.g., an erase request from an external memory controller) when the erase operation is performed by the memory block. When the erase operation is performed by the sub block, a part of the memory cells of the memory block BLKa may be erased, and the rest of the memory cells may be erase-inhibited. A low voltage (e.g., a ground voltage or a low voltage having a level similar to that of the ground voltage) may be supplied to a word line connected to the memory cells to be erased, and a word line connected to the memory cells to be erase-inhibited may be floated.

The memory block BLKa shown in FIG. 2 is exemplary. However, the inventive concept may not be limited thereto. For example, the number of rows of cell strings may be increased or decreased. If the number of rows of cell strings is changed, the number of string or ground selection lines and the number of cell strings connected to a bit line may also be changed.

The number of columns of cell strings may be increased or decreased. If the number of columns of cell strings is changed, the number of bit lines connected to columns of cell strings and the number of cell strings connected to a string selection line may also be changed.

A height of the cell strings may be increased or decreased. For example, the number of ground selection transistors, memory cells, or string selection transistors that are stacked in each cell string may be increased or decreased.

In an exemplary embodiment of the inventive concept, memory cells MC in a physical page may correspond to at least three logical pages. For example, k bits (k being an integer of 2 or more) may be programmed in a memory cell MC. In the memory cells MC in one physical page, k bits programmed in memory cells MC may form k logical pages.

In an exemplary embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells. The associated circuitry may be above or within the substrate. The term "monolithic" may mean that layers of each level of the array are directly deposited on the layers of each underlying level of the array.

In an exemplary embodiment of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents U.S. Pat. Nos. 7,679, 133; 8,553,466; 8,654,587; 8,559,235; and U.S. Pat. Pub. No. 2011/0233648, which are incorporated by reference herein in their entireties, describe configurations of three-dimensional memory arrays for use in accordance with an exemplary embodiment of the inventive concept. In the aforementioned patent documents, a three-dimensional memory array is configured as a plurality of levels, with word lines and/or bit lines shared between levels.

Figure 3:
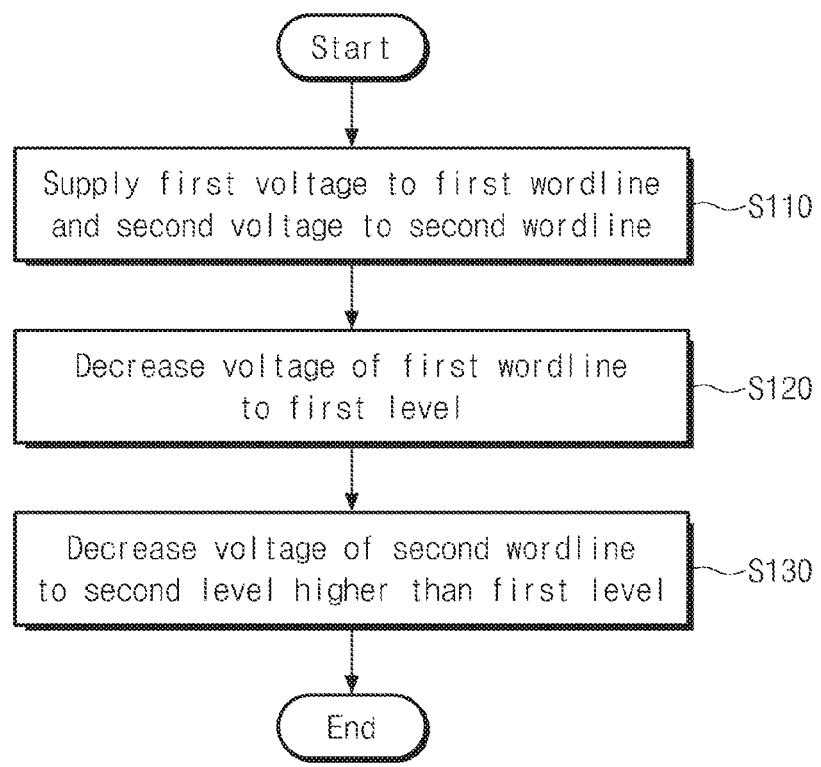
FIG. 3 is a flow chart illustrating an operating method of a nonvolatile memory device according to an exemplary embodiment of the inventive concept.

FIG. 3 is a flow chart illustrating an operating method of a nonvolatile memory device 110 according to an exemplary embodiment of the inventive concept. Referring to FIGS. 1 to 3, in step S110, a first voltage may be supplied to a first word line, and a second voltage may be supplied to a second word line. For example, a level of the second voltage may be higher than that of the first voltage. For example, the second voltage may be a program voltage VPGM to be supplied to a selected word line in a program operation or a non-selection read voltage VREAD to be supplied to an unselected word line in a read operation. The first voltage may be a pass voltage VPASS to be supplied to an unselected word line in a program operation or a selection read voltage VRD to be supplied to a selected word line in a read operation.

Steps S120 and S130 may form a recovery operation. In step S120, a voltage of the first word line may decrease to a first level. In step S130, a voltage of the second word line may decrease to a second level lower than the first level. A voltage difference between the first word line and the second word line may be maintained during a specific time.

Figure 4:
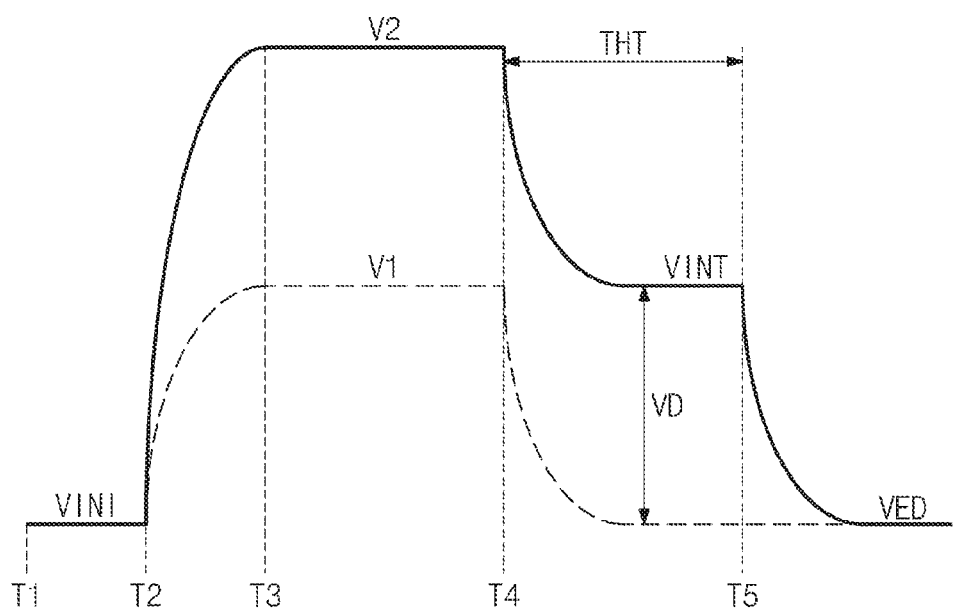
FIG. 4 is a graph illustrating a method for controlling a voltage of a first word line and a voltage of a second word line based on an operating method illustrated in FIG. 3, according to an exemplary embodiment of the inventive concept.

FIG. 4 is a graph illustrating a method for controlling a voltage of a first word line WL1 and a voltage of a second word line WL2 based on an operating method illustrated in FIG. 3, according to an exemplary embodiment of the inventive concept. In FIG. 4, a dotted line may show a variation in a voltage of a first word line WL1 (or unselected word lines WL1 and WL3 to WL6) over time, and a solid line may show a variation in a voltage of a second word line WL2 (or a selected word line WL2) over time. Referring to FIGS. 2 and 4, at T1, the first and second word lines WL1 and WL2 may have an initialization voltage VINI.

At T2, a first voltage V1 may be applied to the first word line WL1 (or the unselected word lines WL1 and WL3 to WL6) and a second voltage V2 may be applied to the second word line WL2 (or the selected word line WL2). A voltage of the first word line WL1 (or the unselected word lines WL1 and WL3 to WL6) may start to rise (increase) to a level of the first voltage V1, and a voltage of the second word line WL2 may start to rise (increase) to a level of the second voltage V2.

At T3, a voltage of the first word line WL1 (or the unselected word lines WL1 and WL3 to WL6) may reach a level of the first voltage V1, and a voltage of the second word line WL2 (or the selected word line WL2) may reach a level of the second voltage V2. The voltages of the first and second word lines WL1 and WL2 (or the word lines WL1 to WL6) may be maintained up to T4.

For example, in a program operation, the second voltage V2 may be a program voltage VPGM, and the first voltage V1 may be a pass voltage VPASS. Memory cells MC2 connected to the second word line WL2 to which the second voltage V2 is applied may be programmed. For example, Fowler-Nordheim (F-N) tunneling may occur due to a voltage difference between control gates and channels of the memory cells MC2, and electrons of the channels of the memory cells MC2 may move to charge storage layers of the memory cells MC2. The electrons thus moved may be trapped by the charge storage layers, thereby increasing threshold voltages of the memory cells MC2.

However, a certain amount of time (e.g., a trap time) may be required for the electrons thus moved to be trapped by the charge storage layers of the memory cells MC2. The electrons thus moved may have mobility without stability until the trap time elapses.

In the case where voltages of the first and second word lines WL1 and WL2 are conventionally discharged, electric fields may be formed between second memory cells MC2 and first memory cells MC1 and between the second memory cells MC2 and third memory cells MC3. For example, an electric field toward the second memory cells MC2 from the first memory cells MC1 and an electric field toward the second memory cells MC2 from the third memory cells MC3 may be formed due to electrons moved into charge storage layers of the second memory cells MC2.

Electrons that move into the charge storage layers of the second memory cells MC2 from their channels but are not trapped may move toward a direction of the first memory cells MC1 or the third memory cells MC3 due to the electric fields thus generated. According to an exemplary embodiment of the inventive concept, a deep trap, which traps electrons having mobility at a deep level, may be made by performing an operation to fix the electrons having mobility to positions where trapped electrons are located. For example, in a recovery operation, the nonvolatile memory 110 according to an exemplary embodiment of the inventive concept may maintain a voltage of the second word line WL2 to be higher than a voltage of the first word line WL1 during a holding time THT. The voltage of the second word line WL2 may be kept higher than the voltage of the first word line WL1 for more than the holding time THT.

In detail, at T4, a voltage of the first word line WL1 (or the unselected word lines WL1 and WL3 to WL6) may decrease to a first level. The first level may be a ground level or a negative or positive level similar to the ground level. A voltage of the second word line WL2 (or the selected word line WL2) may decrease to a second level higher than the first level, for example, an intermediate level VINT. In an exemplary embodiment of the inventive concept, the recovery control circuit RC may control the address decoder circuit 113 to allow a voltage with the intermediate level VINT to be supplied to the second word line WL2 (or the selected word line WL2) at T4.

At T5, voltages of the first and second word lines WL1 and WL2 (or the word lines WL1 to WL6) may be discharged to an end voltage VED. The time between T4 and T5 may be about 10 µs. In FIG. 4, the end voltage VED is illustrated as being the same as the first level to which the first word line WL1 (or the unselected word lines WL1 and WL3 to WL6) is discharged. However, a level of the end voltage VED may be different from the first level. For example, a voltage of the first word line WL1 may be discharged from the first level to an end voltage VED having a level greater or less than the first level. Furthermore, in FIG. 4, the first and second word lines WL1 and WL2 (or the word lines WL1 to WL6) may be illustrated as being discharged to the same level, but the inventive concept may not be limited thereto. Voltages of the first and second word lines WL1 and WL2 (or the word lines WL1 to WL6) may be discharged to different levels, respectively.

As illustrated in FIG. 4, according to an exemplary embodiment of the inventive concept, a voltage difference VD between the first and second word lines WL1 and WL2 may be maintained during the holding time THT in the recovery operation. The voltage difference VD may not be limited to a fixed difference.

In an exemplary embodiment of the inventive concept, in a program recovery operation, a voltage of the second word line WL2 (or the selected word line WL2) may decrease to the intermediate level VINT, and voltages of the first and third word lines WL1 and WL3 (or the unselected word lines WL1 and WL3 to WL6) may decrease to a level lower than the intermediate level VINT by the voltage difference VD. Since a voltage of the second word line WL2 (or the selected word line WL2) is higher than voltages of the first and third word lines WL1 and WL3 (or the unselected word lines WL1 and WL3 to WL6), an electric field toward the first memory cells MC1 from the second memory cells MC2 and an electric field toward the third memory cells MC3 from the second memory cells MC2 may be formed. The electric fields thus formed may allow electrons, moved to the second memory cells MC2 from channels, to stay in the charge storage layers of the second memory cells MC2. During the holding time THT, the electrons that stay in the charge storage layers of the second memory cells MC2 may be normally trapped (or deep trapped). Accordingly, threshold voltages of the second memory cells MC2 may not vary even though voltages of the first to third word lines WL1 to WL3 (or unselected word lines WL1 and WL3 to WL6) are discharged after the holding time THT elapses. In other words, data programmed in the second memory cells MC2 may be more reliable. In other words, the nonvolatile memory 110 may have better reliability and an operating method of the nonvolatile memory 110 may be provided.

In FIG. 4, the inventive concept is described with reference to a program operation. However, the inventive concept may not be limited thereto. For example, a voltage difference VD and/or a holding time THT according to an exemplary embodiment of the inventive concept may be applied when a recovery operation is performed after voltages having different levels are applied to the word lines WL1 to WL6.

For example, in a read operation, a non-selection read voltage may be applied to unselected word lines, and a selection read voltage VRD may be applied to a selected word line. The non-selection read voltage VREAD may be a high voltage to be applied to word lines connected to memory cells that are not read targets. The selection read voltage VRD may be applied to memory cells that are read targets and may have a level lower than that of the non-selection read voltage VREAD. When a recovery operation is executed after the non-selection read voltage VREAD and the selection read voltage VRD are applied, the selection read voltage VRD may decrease to a first level, and the non-selection read voltage VREAD may decease to a second level higher than the first level.

Figure 5:
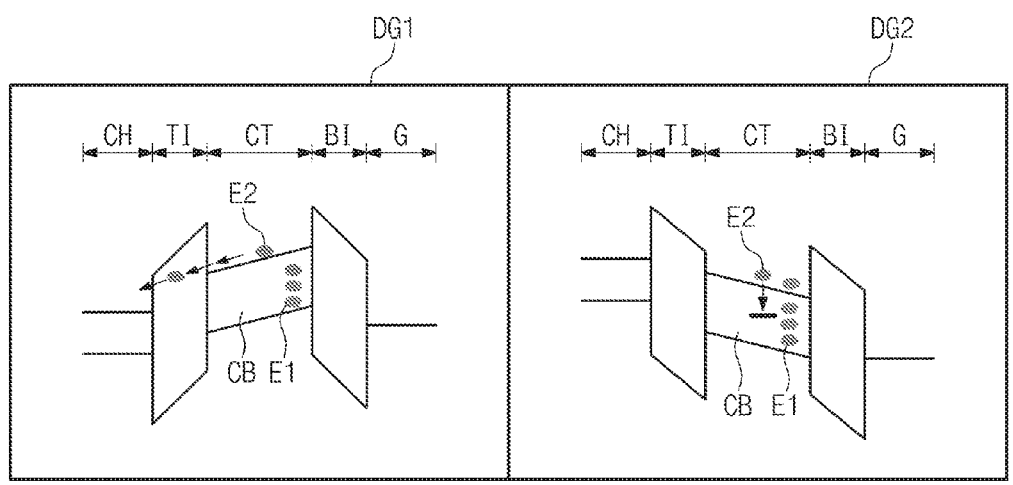
FIG. 5 illustrates a voltage variation of a memory cell to which an operating method illustrated in FIG. 4 is applied, according to an exemplary embodiment of the inventive concept.

FIG. 5 illustrates a voltage variation of a memory cell to which an operating method illustrated in FIG. 4 is applied, according to an exemplary embodiment of the inventive concept. In FIG. 5, a first graph DG1 illustrates potentials of a memory cell connected to a selected word line when voltages of the selected word line and an unselected word line are recovered to the same level. A second graph DG2 illustrates potentials of a memory cell connected to the selected word line when a voltage of the selected word line is recovered to a level higher than that of a voltage of the unselected word line.

Referring to the first graph DG1, potentials of a channel CH, a tunnel insulation layer TI, a charge trap layer CT, a blocking insulation layer BI, and a control gate G of a memory cell are illustrated. The tunnel insulation layer TI and the blocking insulation layer BI may serve as potential barriers.

When a memory cell is programmed, electrons may enter the charge trap layer CT of the memory cell. In an exemplary embodiment of the inventive concept, trapped electrons E1 and electrons E2 not trapped are illustrated in the first graph DG1. When a recovery operation is performed before the electrons E2 are trapped, energy bands may be formed as illustrated in the first graph E1, and the electrons E2 not trapped may move into the channel CH.

According to an exemplary embodiment of the inventive concept, a voltage of a selected word line may decrease to a level higher than that of a voltage of an unselected word line. Accordingly, in a recovery operation, energy bands may be formed as illustrated in the second graph DG2, and the electrons E2 not trapped may be kept in the channel CH. The electrons E2 kept in the charge trap layer CT may be trapped in the charge trap layer CT. Accordingly, the electrons E2 that are not trapped in the charge trap layer CT by a conventional program and recovery operation may be trapped in the charge trap layer CT by the program and recovery operation according to an exemplary embodiment of the inventive concept. In other words, a deep trap may be made.

Figure 6:
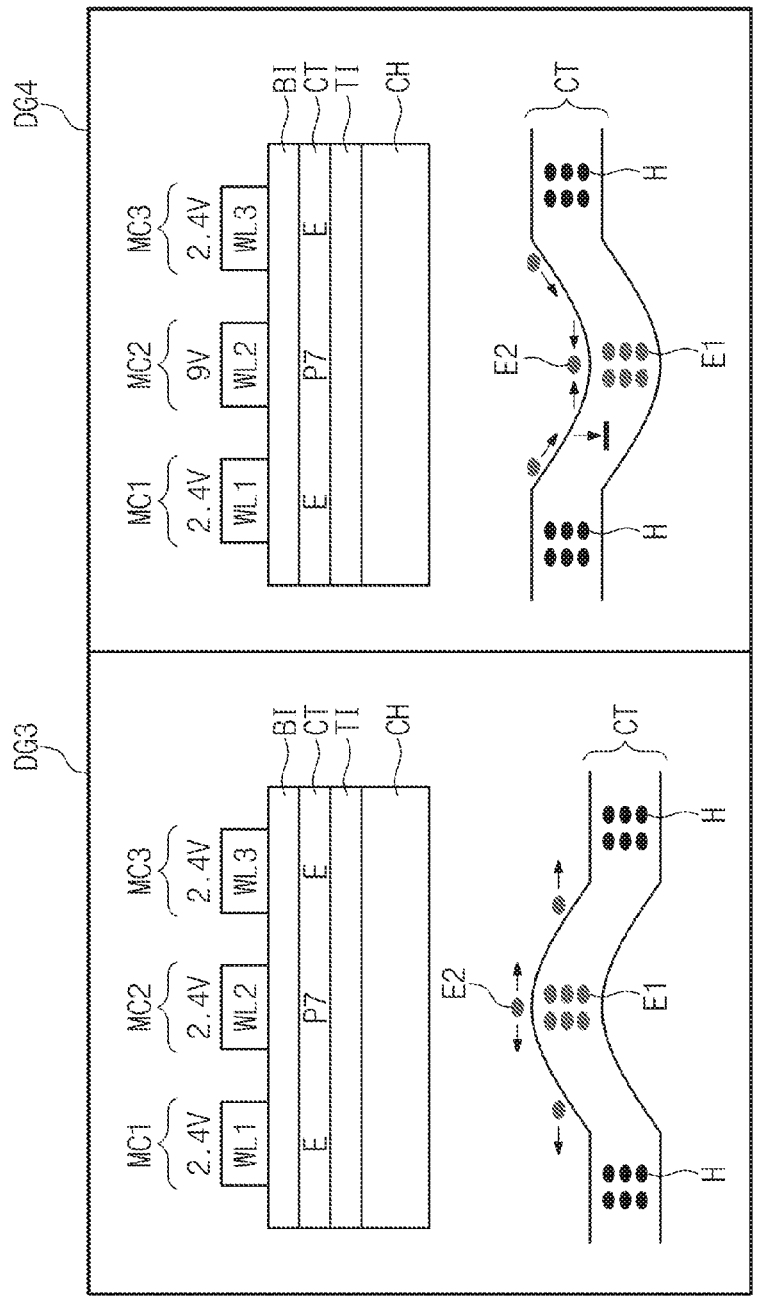
FIG. 6 illustrates a voltage variation of a memory cell to which an operating method illustrated in FIG. 4 is applied, according to an exemplary embodiment of the inventive concept.

FIG. 6 illustrates a voltage variation of memory cells to which an operating method illustrated in FIG. 4 is applied, according to an exemplary embodiment of the inventive concept. In FIG. 6, a third graph DG3 illustrates potentials of memory cells when voltages of a selected word line and an unselected word line are recovered to the same level. A fourth graph DG4 illustrates potentials of memory cells when a voltage of the selected word line is recovered to a level higher than that of a voltage of the unselected word line.

Referring to the third graph DG3, each memory cell may include a channel CH, a tunnel insulation layer TI, a charge trap layer CT, a blocking insulation layer BI, and a word line WL (or a control gate). A second word line WL2 of first to third word lines WL1 to WL3 may be selected. Memory cells MC1 and MC3 corresponding to the first and third word lines WL1 and WL3 may remain in an erase state. In other words, holes H may exist at charge trap layers CT of the first and third memory cells MC1 and MC3. The second memory cell MC2 corresponding to a second word line WL2 may be programmed to a program state P7, and a threshold voltage of the memory cell MC2 having the program state P7 may be higher than that of a memory cell (MC1 and MC3) having the erase state E. As the second memory cell MC2 is programmed, electrons E1 may be trapped at the charge trap layer CT of the second memory cell MC2.

In the case where voltages of the selected word line WL2 and unselected word lines WL1 and WL3 are discharge to the same level, as illustrated in the third graph DG3, potentials of the charge trap layers CT of the memory cells MC1 to MC3 may be determined by electrons trapped in the charge trap layers CT or holes thereof. For example, since holes H exist in the charge trap layers CT of the memory cells MC1 and MC3 in the erase state E and electrons E1 and E2 exist in the charge trap layer CT of the memory cell MC2 programmed, a potential of the charge trap layer CT of the selected memory cell MC2 may be lower than potentials of the charge trap layers CT of the unselected memory cells MC1 and MC3.

The electrons E1 already trapped in the charge trap layer CT of the selected memory cell MC2 may not be influenced by potentials of the charge trap layers CT of the memory cells MC1 to MC3. The electrons E2 that are placed in the charge trap layer CT of the selected memory cell MC2 and are not yet trapped may be influenced by potentials of the charge trap layers CT of the memory cells MC1 to MC3. For example, as illustrated in the third graph DG3, the electrons E2 placed in the charge trap layer CT of the selected memory cell MC2 may move toward the charge trap layers CT of the unselected memory cells MC1 and MC3.

According to an exemplary embodiment of the inventive concept, a voltage of a selected word line may decrease to a level higher than that of a voltage of an unselected word line. Accordingly, as illustrated in the fourth graph DG4, an electric field generated by voltages of the word lines WL1 to WL3 makes it possible to maintain a potential of the charge trap layer CT of the selected memory cell MC2 to be higher than potentials of the charge trap layers CT of the unselected memory cells MC1 and MC3 and allows electrons E2 not yet trapped to stay in the charge trap layer CT of the selected memory cell MC2. The electrons E2 that stay in the charge trap layer CT may be trapped in the charge trap layer CT over time. Accordingly, the electrons E2 not trapped in the charge trap layer CT by a conventional program and recovery operation may be trapped at the charge trap layer CT by the program and recovery operation according to an exemplary embodiment of the inventive concept. In other words, a deep trap may be made.

Figure 7:
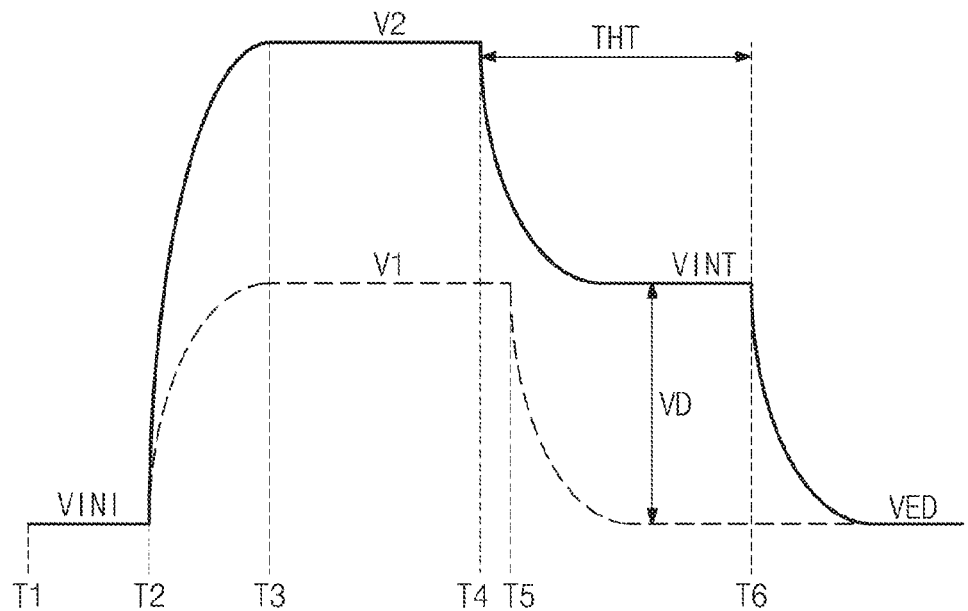
FIG. 7 is a graph illustrating a method for controlling a voltage of a first word line and a voltage of a second word line based on an operating method illustrated in FIG. 3, according to an exemplary embodiment of the inventive concept.

FIG. 7 is a graph illustrating a method for controlling a voltage of a first word line WL1 (or unselected word lines WL1 and WL3 to WL6) and a voltage of a second word line WL2 (or a selected word line WL2) based on an operating method illustrated in FIG. 3, according to an exemplary embodiment of the inventive concept. In FIG. 7, a dotted line may show a variation in a voltage of the first word line WL1 (or unselected word lines WL1 and WL3 to WL6) over time, and a solid line may show a variation in a voltage of the second word line WL2 (or a selected word line WL2) over time. Referring to FIGS. 2 and 7, at T1, the first and second word lines WL1 and WL2 (or word lines WL1 to WL6) may have an initialization voltage VINI.

At T2, a first voltage V1 may be applied to the first word line WL1 (or the unselected word lines WL1 and WL3 to WL6) and a second voltage V2 may be applied to the second word line WL2 (or the selected word line WL2). A voltage of the first word line WL1 (or the unselected word lines WL1 and WL3 to WL6) may start to rise (increase) to a level of the first voltage V1, and a voltage of the second word line WL2 (or the selected word line WL2) may start to rise (increase) to a level of the second voltage V2.

At T3, a voltage of the first word line WL1 (or the unselected word lines WL1 and WL3 to WL6) may reach a level of the first voltage V1, and a voltage of the second word line WL2 (or the selected word line WL2) may reach a level of the second voltage V2.

At T5, a voltage of the first word line WL1 (or the unselected word lines WL1 and WL3 to WL6) may decrease to the first level. At T4 preceding T5, a voltage of the second word line WL2 (or the selected word line WL2) may decrease to a second level higher than the first level, for example, an intermediate level VINT. A voltage difference VD between the first word line WL1 (or the unselected word lines WL1 and WL3 to WL6) and the second word line WL2 (or the selected word line WL2) may be maintained during a holding time THT. The voltage difference VD may not be limited to a fixed difference.

Afterwards, at T6, voltages of the first and second word lines WL1 and WL2 (or the word lines WL1 to WL6) may decrease to an end voltage VED.

As compared with the embodiment illustrated in FIG. 4, a voltage of the first word line WL1 (or the unselected word lines WL1 and WL3 to WL6) may start to decrease from the first voltage V1 after a voltage of the second word line WL2 (or the selected word line WL2) starts to decrease and before a voltage of the second word line WL2 (or the selected word line WL2) reaches the intermediate level VINT.

Figure 8:
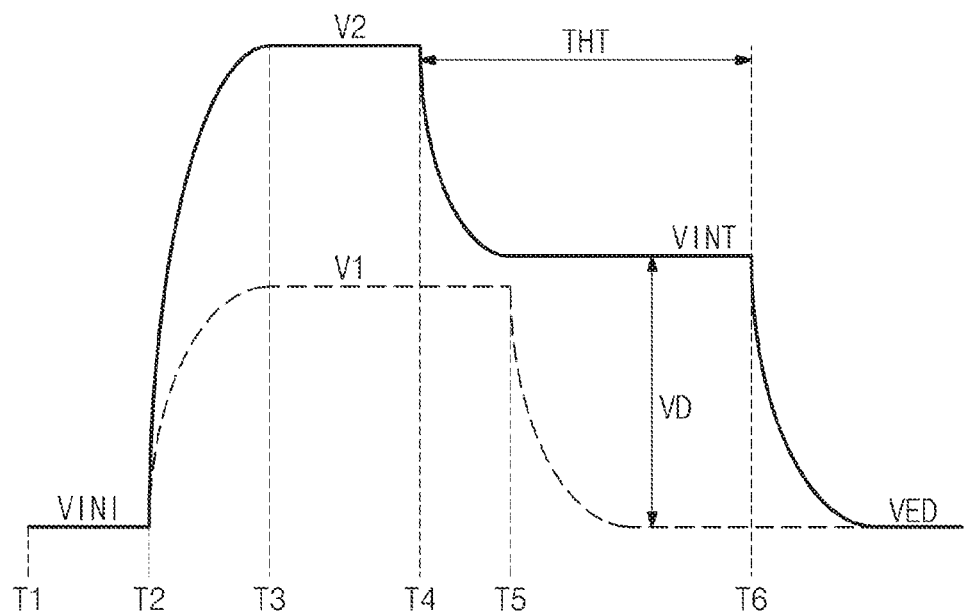
FIG. 8 is a graph illustrating a method for controlling a voltage of a first word line and a voltage of a second word line based on an operating method illustrated in FIG. 3, according to an exemplary embodiment of the inventive concept.

FIG. 8 is a graph illustrating a method for controlling a voltage of a first word line WL1 (or unselected word lines WL1 and WL3 to WL6) and a voltage of a second word line WL2 (or a selected word line WL2) based on an operating method illustrated in FIG. 3, according to an exemplary embodiment of the inventive concept. In FIG. 8, a dotted line may show a variation in a voltage of the first word line WL1 (or unselected word lines WL1 and WL3 to WL6) over time, and a solid line may show a variation in a voltage of the second word line WL2 (or a selected word line WL2) over time. Referring to FIGS. 2 and 8, at T1, the first and second word lines WL1 and WL2 (or word lines WL1 to WL6) may have an initialization voltage VINI.

At T2, a first voltage V1 may be applied to the first word line WL1 (or the unselected word lines WL1 and WL3 to WL6) and a second voltage V2 may be applied to the second word line WL2 (or the selected word line WL2). A voltage of the first word line WL1 (or the unselected word lines WL1 and WL3 to WL6) may start to rise (increase) to a level of the first voltage V1, and a voltage of the second word line WL2 (or the selected word line WL2) may start to rise (increase) to a level of the second voltage V2.

At T3, a voltage of the first word line WL1 (or the unselected word lines WL1 and WL3 to WL6) may reach a level of the first voltage V1, and a voltage of the second word line WL2 (or the selected word line WL2) may reach a level of the second voltage V2.

At T5, a voltage of the first word line WL1 (or the unselected word lines WL1 and WL3 to WL6) may decrease to the first level. At T4 preceding T5, a voltage of the second word line WL2 (or the selected word line WL2) may decrease to a second level higher than the first level, for example, an intermediate level VINT. A voltage difference VD between the first word line WL1 (or the unselected word lines WL1 and WL3 to WL6) and the second word line WL2 (or the selected word line WL2) may be maintained during a holding time THT. The voltage difference VD may not be limited to a fixed difference.

Afterwards, at T6, voltages of the first and second word lines WL1 and WL2 (or the word lines WL1 to WL6) may decrease to an end voltage VED.

As compared with the embodiment illustrated in FIG. 4, a voltage of the first word line WL1 (or the unselected word lines WL1 and WL3 to WL6) may start to decrease from the first voltage V1 after a voltage of the second word line WL2 (or the word lines WL1 to WL6) reaches an intermediate voltage VINT.

Figure 9:
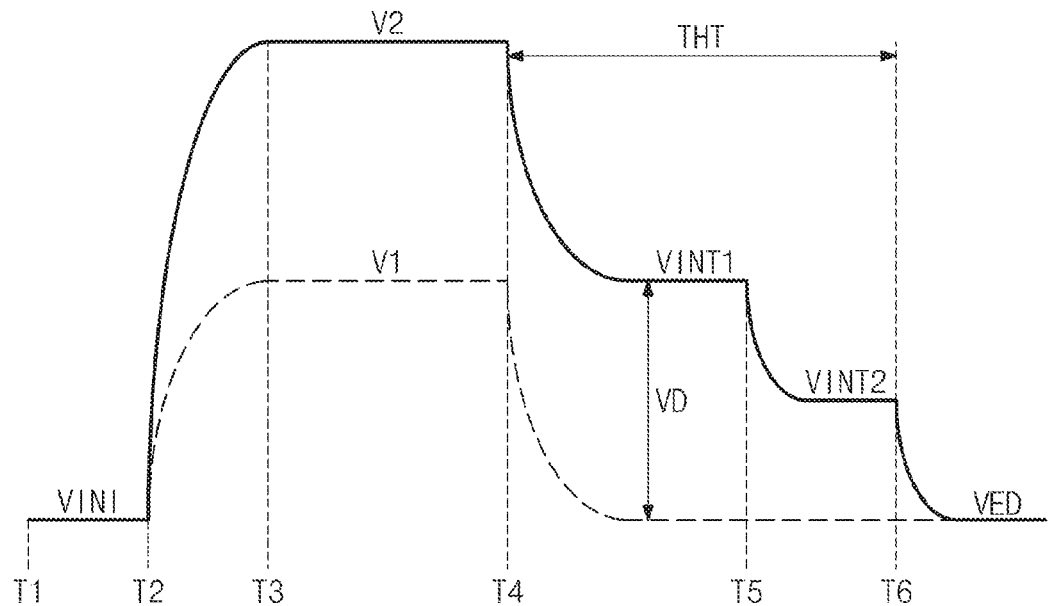
FIG. 9 is a graph illustrating a method for controlling a voltage of a first word line and a voltage of a second word line based on an operating method illustrated in FIG. 3, according to an exemplary embodiment of the inventive concept.

FIG. 9 is a graph illustrating a method for controlling a voltage of a first word line WL1 (or unselected word lines WL1 and WL3 to WL6) and a voltage of a second word line WL2 (or a selected word line WL2) based on an operating method illustrated in FIG. 3, according to an exemplary embodiment of the inventive concept. In FIG. 9, a dotted line may show a variation in a voltage of the first word line WL1 (or unselected word lines WL1 and WL3 to WL6) over time, and a solid line may show a variation in a voltage of the second word line WL2 (or a selected word line WL2) over time. Referring to FIGS. 2 and 9, at T1, the first and second word lines WL1 and WL2 (or word lines WL1 to WL6) may have an initialization voltage VINI.

At T2, a first voltage V1 may be applied to the first word line WL1 (or the unselected word lines WL1 and WL3 to WL6) and a second voltage V2 may be applied to the second word line WL2 (or the selected word line WL2). A voltage of the first word line WL1 (or the unselected word lines WL1 and WL3 to WL6) may start to rise (increase) to a level of the first voltage V1, and a voltage of the second word line WL2 (or the selected word line WL2) may start to rise (increase) to a level of the second voltage V2.

At T3, a voltage of the first word line WL1 (or the unselected word lines WL1 and WL3 to WL6) may reach a level of the first voltage V1, and a voltage of the second word line WL2 (or the selected word line WL2) may reach a level of the second voltage V2.

At T4, voltages of the first and second word lines WL1 and WL2 (or the word lines WL1 to WL6) may decrease. A voltage of the first word line WL1 (or the unselected word lines WL1 and WL3 to WL6) may decrease to the first level, and a voltage of the second word line WL2 (or the selected word line WL2) may decrease to a second level higher than the first level, for example, a first intermediate level VINT1. At T5, a voltage of the second word line WL2 (or the selected word line WL2) may decrease to a second intermediate level VINT2 that is higher than the first level and lower than the first intermediate level VINT1. A voltage difference VD between the first word line WL1 (or the unselected word lines WL1 and WL3 to WL6) and the second word line WL2 (or the selected word line WL2) may be maintained during a holding time THT.

Afterwards, at T6, voltages of the first and second word lines WL1 and WL2 (or the word lines WL1 to WL6) may decrease to an end voltage VED.

As compared with the embodiment illustrated in FIG. 4, a voltage of the second word line WL2 (or the selected word line WL2) may stepwise decrease passing through two or more intermediate levels VINT1 and VINT2.

In FIG. 9, voltages of the first and second word lines WL1 and WL2 (or the word lines WL1 to WL6) are illustrated as decreasing at the same time T4. However, as described with reference to FIG. 7, a voltage of the first word line WL1 (or the unselected word lines WL1 and WL3 to WL6) may decrease from the first voltage V1 after a voltage of the second word line WL2 (or the selected word line WL2) starts to decrease from the second voltage V2 and before a voltage of the second word line WL2 (or the selected word line WL2) reaches the first intermediate level VINT1. In addition, as described with reference to FIG. 8, a voltage of the first word line WL1 (or the unselected word lines WL1 and WL3 to WL6) may decrease from the first voltage V1 after a voltage of the second word line WL2 (or the selected word line WL2) reaches the first intermediate level VINT1.

Figure 10:
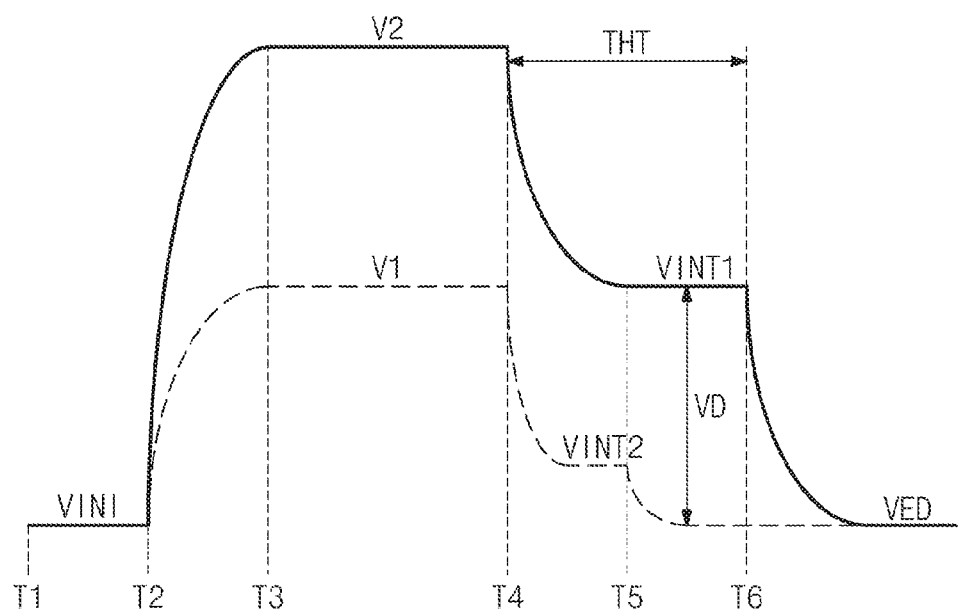
FIG. 10 is a graph illustrating a method for controlling a voltage of a first word line and a voltage of a second word line based on an operating method illustrated in FIG. 3, according to an exemplary embodiment of the inventive concept.

FIG. 10 is a graph illustrating a method for controlling a voltage of a first word line WL1 (or unselected word lines WL1 and WL3 to WL6) and a voltage of a second word line WL2 (or a selected word line WL2) based on an operating method illustrated in FIG. 3, according to an exemplary embodiment of the inventive concept. In FIG. 10, a dotted line may show a variation in a voltage of the first word line WL1 (or unselected word lines WL1 and WL3 to WL6) over time, and a solid line may show a variation in a voltage of the second word line WL2 (or a selected word line WL2) over time. Referring to FIGS. 2 and 10, at T1, the first and second word lines WL1 and WL2 (or word lines WL1 to WL6) may have an initialization voltage VINI.

At T2, a first voltage V1 may be applied to the first word line WL1 (or the unselected word lines WL1 and WL3 to WL6) and a second voltage V2 may be applied to the second word line WL2 (or the selected word line WL2). A voltage of the first word line WL1 (or the unselected word lines WL1 and WL3 to WL6) may start to rise (increase) to a level of the first voltage V1, and a voltage of the second word line WL2 (or the selected word line WL2) may start to rise (increase) to a level of the second voltage V2.

At T3, a voltage of the first word line WL1 (or the unselected word lines WL1 and WL3 to WL6) may reach a level of the first voltage V1, and a voltage of the second word line WL2 (or the selected word line WL2) may reach a level of the second voltage V2.

At T4, voltages of the first and second word lines WL1 and WL2 (or the word lines WL1 to WL6) may decrease. A voltage of the first word line WL1 (or the unselected word lines WL1 and WL3 to WL6) may decrease to a second intermediate level VINT2, and a voltage of the second word line WL2 (or the selected word line WL2) may decrease to a first intermediate level VINT1 higher than the second intermediate level VINT2. At T5, a voltage of the first word line WL1 (or the unselected word lines WL1 and WL3 to WL6) may decrease from the second intermediate level VINT2. A voltage difference VD between the first word line WL1 and the second word line WL2 may be maintained during a holding time THT.

Afterwards, at T6, voltages of the first and second word lines WL1 and WL2 may decrease to an end voltage VED.

As compared with the embodiment illustrated in FIG. 4, a voltage of the second word line WL2 (or the selected word line WL2) may stepwise decrease passing through the second intermediate level VINT2.

In FIG. 10, voltages of the first and second word lines WL1 and WL2 (or the word lines WL1 to WL6) are illustrated as decreasing at the same time T4. However, as described with reference to FIG. 7, a voltage of the first word line WL1 (or the unselected word lines WL1 and WL3 to WL6) may decrease from the first voltage V1 after a voltage of the second word line WL2 (or the selected word line WL2) starts to decrease from the second voltage V2 and before a voltage of the second word line WL2 (or the selected word line WL2) reaches the first intermediate level VINT1. In addition, as described with reference to FIG. 8, a voltage of the first word line WL1 (or the unselected word lines WL1 and WL3 to WL6) may decrease from the first voltage V1 after a voltage of the second word line WL2 (or the selected word line WL2) reaches the first intermediate level VINT1.

Figure 11:
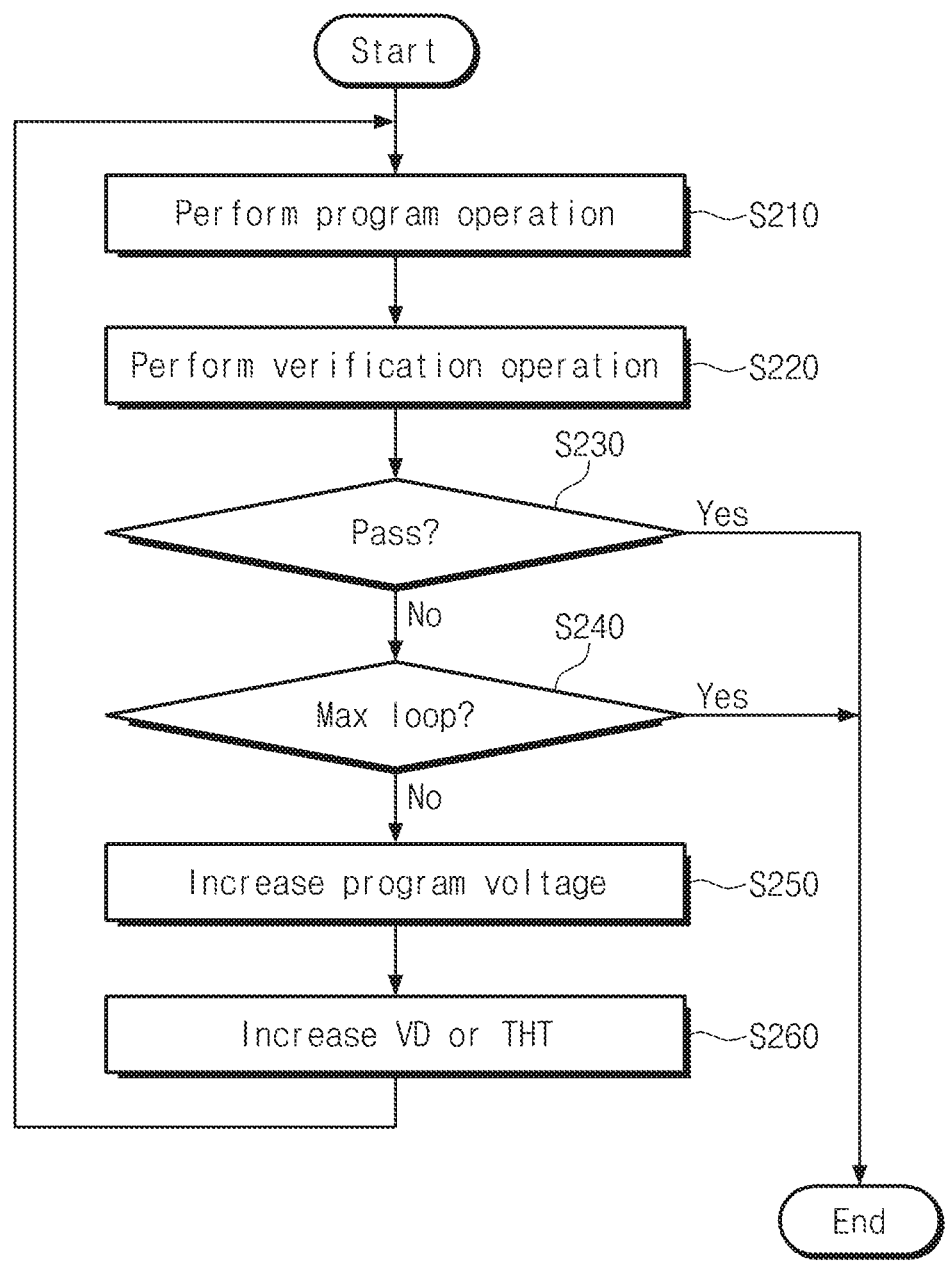
FIG. 11 is a flow chart illustrating an operating method of programming a nonvolatile memory, according to an exemplary embodiment of the inventive concept.

FIG. 11 is a flow chart illustrating an operating method of programming the nonvolatile memory 110, according to an exemplary embodiment of the inventive concept. Referring to FIGS. 1, 2, and 11, in step S210, a program operation may be performed. For example, voltages of bit lines BL1 and BL2 may be adjusted based on data to be programmed in memory cells MC. A program voltage VPGM may be applied to a second word line WL2 connected to memory cells to be programmed, for example, second memory cells MC2, and pass voltages VPASS may be applied to first and third to six word lines WL1 and WL3 to WL6 connected to remaining memory cells, for example, first and third to sixth memory cells MC1 and MC3 to MC6.

Afterwards, voltages of the word lines WL1 to WL6 may be recovered using at least one of methods described with reference to FIGS. 4 and 7 to 10. For example, voltages of the word lines WL1 and WL3 to WL6 to which the pass voltages VPASS are applied may be recovered in the same manner as a first voltage V1, as described with reference to FIGS. 4 and 7 to 10. A voltage of the word line WL2 to which the program voltage VPGM is applied may be recovered in the same manner as a second voltage V2, as described with reference to FIGS. 4 and 7 to 10.

In step S220, a verification operation may be performed. For example, the bit lines BL1 and BL2 may be floated after a power supply voltage is applied to the bit lines BL1 and BL2. A verification voltage VF may be applied to the second word line WL2 to which the program voltage VPGM has been applied, and non-selection read voltages VREAD may be applied to the first and third to sixth word lines WL1 and WL3 to WL6 to which the pass voltages VPASS have been applied.

For example, the second memory cells MC2 may be programmed to have a plurality of program states or an erase state. The program states may correspond to different threshold voltage distributions ranges. Lower limit voltages of threshold voltage distributions ranges corresponding to the program states may be used as verification voltages VF. The second memory cells MC2 programmed to the program states may be verified using corresponding verification voltages VF, respectively.

Afterwards, threshold voltages of the second memory cells MC2 may be identified based on voltage variations of the bit lines BL1 and BL2 or the amount of current flowing through each of the bit lines BL1 and BL2.

In step S230, program pass or fail may be determined based on a result of identifying threshold voltages of the second memory cells MC2. For example, whether program states of the second memory cells MC2 are program passed may be determined. For example, the case where programming of the second memory cells MC2 is completed may be determined as being program passed. In addition, the case where the number of second memory cells MC2 that have not been program completed is smaller than or equal to a reference value may be determined as being program passed. For example, in the case where a threshold voltage of a specific programmed memory cell is higher than a verification voltage VF corresponding to a specific program state, the specific programmed memory cell may be identified as being program-completed. In this case, the method may end.

The case where the programming of the second memory cells MC2 is not completed may be determined as being program failed. In addition, the case where the number of second memory cells MC2 that have not been program completed is greater than the reference value may be determined as being program failed. In this case, the method proceeds to step S240.

In step S240, whether a program loop reaches a max loop may be determined. For example, a program operation of step S210 and a verification operation of step S220 may form a program loop. When the number of program loops executed reaches a predetermined threshold value, the method may end. Afterwards, the programmed memory cells may be managed as an error occurs during programming. When the number of program loops executed is smaller than the threshold value, in step S250, a program voltage VPGM may increase, and in step S260, a voltage difference VD or a holding time THT may be adjusted (e.g., increase). Afterwards, the method may return to step S210.

Figure 12:
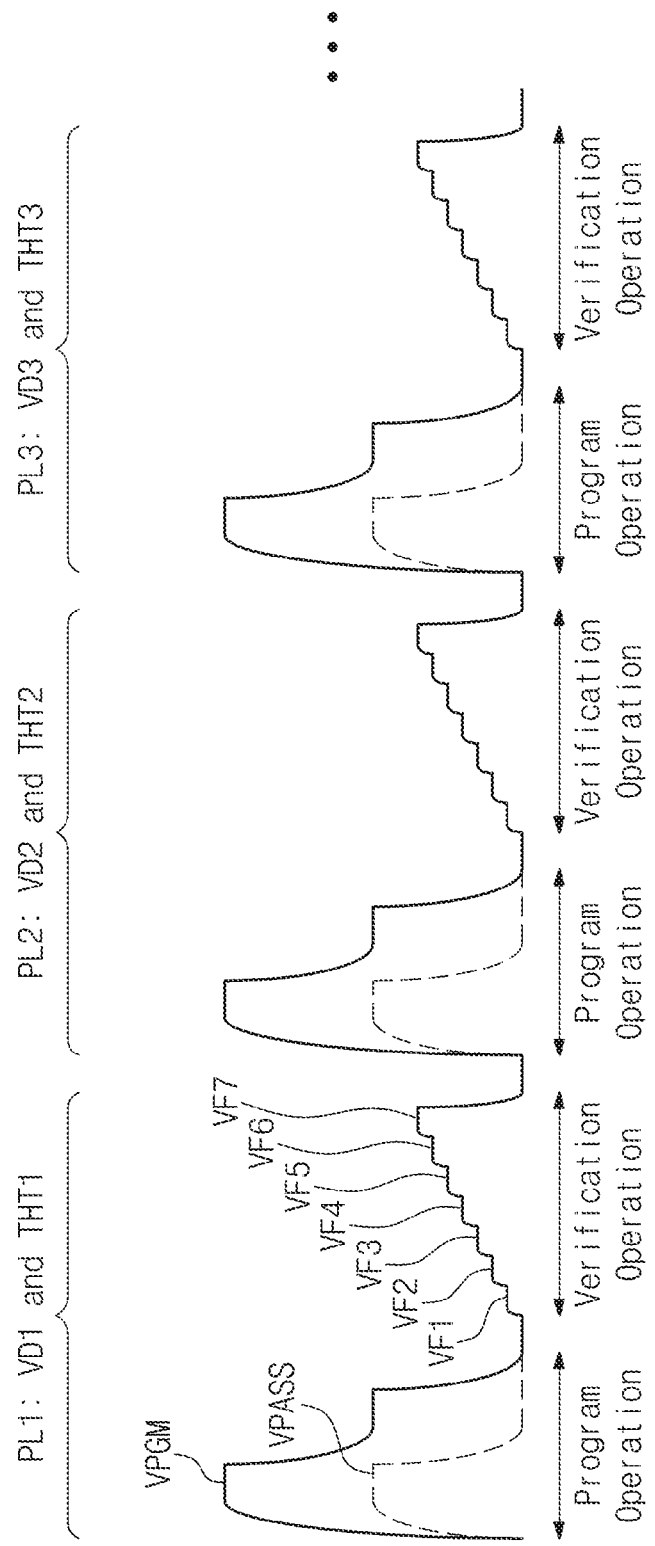
FIG. 12 is a graph for describing a method for adjusting a voltage difference or a holding time using an operating method illustrated in FIG. 11, according to an exemplary embodiment of the inventive concept.

FIG. 12 is a graph for describing a method for adjusting a voltage difference VD or a holding time THT using an operating method illustrated in FIG. 11, according to an exemplary embodiment of the inventive concept. In FIG. 12, a solid line shows a voltage variation of a selected word line (e.g., WL2) over time in a program operation, and a dotted line shows a voltage variation of an unselected word line (e.g., WL1) over time in a program operation. Referring to FIGS. 2 and 12, a program operation and a verification operation of a first program loop PL1 may be performed. In a program operation, a program voltage VPGM may be applied to the selected word line WL2, and a pass voltage VPASS may be applied to the unselected word line WL1. As described with reference to FIGS. 4 and 7 to 10, in a program recovery operation, a voltage of the selected word line WL2 and a voltage of the unselected word line WL1 may decrease to satisfy the following conditions: a first voltage difference VD1 and a first holding time THT1.

In a verification operation, first to seventh verification voltages VF1 to VF7 may be sequentially applied to the selected and unselected word lines WL2 and WL1. In an exemplary embodiment of the inventive concept, in the case where 3-bit data is programmed at each memory cell MC, the first to seventh verification voltages VF1 to VF7 may be used. As the number of bits to be programmed per cell is changed, the number of verification voltages VF may be also changed.

When a result of a verification operation of the first program loop PL1 indicates program fail, a second program loop PL2 may be performed. A level of the program voltage VPGM of the second program loop PL2 may be set to be higher than that of the first program loop PL1. Furthermore, in the second program loop PL2, a voltage of the selected word line WL2 and a voltage of the unselected word line WL1 may decrease to satisfy the following conditions: a second voltage difference VD2 and a second holding time THT2. The second voltage difference VD2 may be greater than the first voltage difference VD1, and the second holding time THT2 may be longer than the first holding time THT1.

When a result of a verification operation of the second program loop PL2 indicates program fail, a third program loop PL3 may be performed. A level of the program voltage VPGM of the third program loop PL3 may be set to be higher than that of the second program loop PL2. Furthermore, in the third program loop PL3, a voltage of the selected word line WL2 and a voltage of the unselected word line WL1 may decrease to satisfy the following conditions: a third voltage difference VD3 and a third holding time THT3. The third voltage difference VD3 may be greater than the second voltage difference VD2, and the third holding time THT3 may be longer than the second holding time THT2.

In other words, as a program loop repeats, in a program recovery operation, a voltage difference VD between the program voltage VPGM and the pass voltage VPASS may increase, or a holding time THT when a voltage difference VD is maintained may increase.

In FIGS. 11 and 12, the voltage difference VD or the holding time THT is described as being adjusted whenever a program loop repeats. However, the number of events that cause the voltage difference VD or the holding time THT to be adjusted may not be limited thereto. For example, the voltage difference VD or the holding time THT may be adjusted when a program loop repeats by a predetermined count. The voltage difference VD may be adjusted when a program loop is performed by a first number of times, and the holding time THT may be adjusted when a program loop is performed by a second number of times. As another example, the voltage difference VD or the holding time THT may be adjusted when a program loop is performed by a third number of times. The holding time THT may not be adjusted when the voltage difference VD is adjusted; and the holding time THT may be adjusted when the voltage difference VD is not adjusted.

Figure 13:
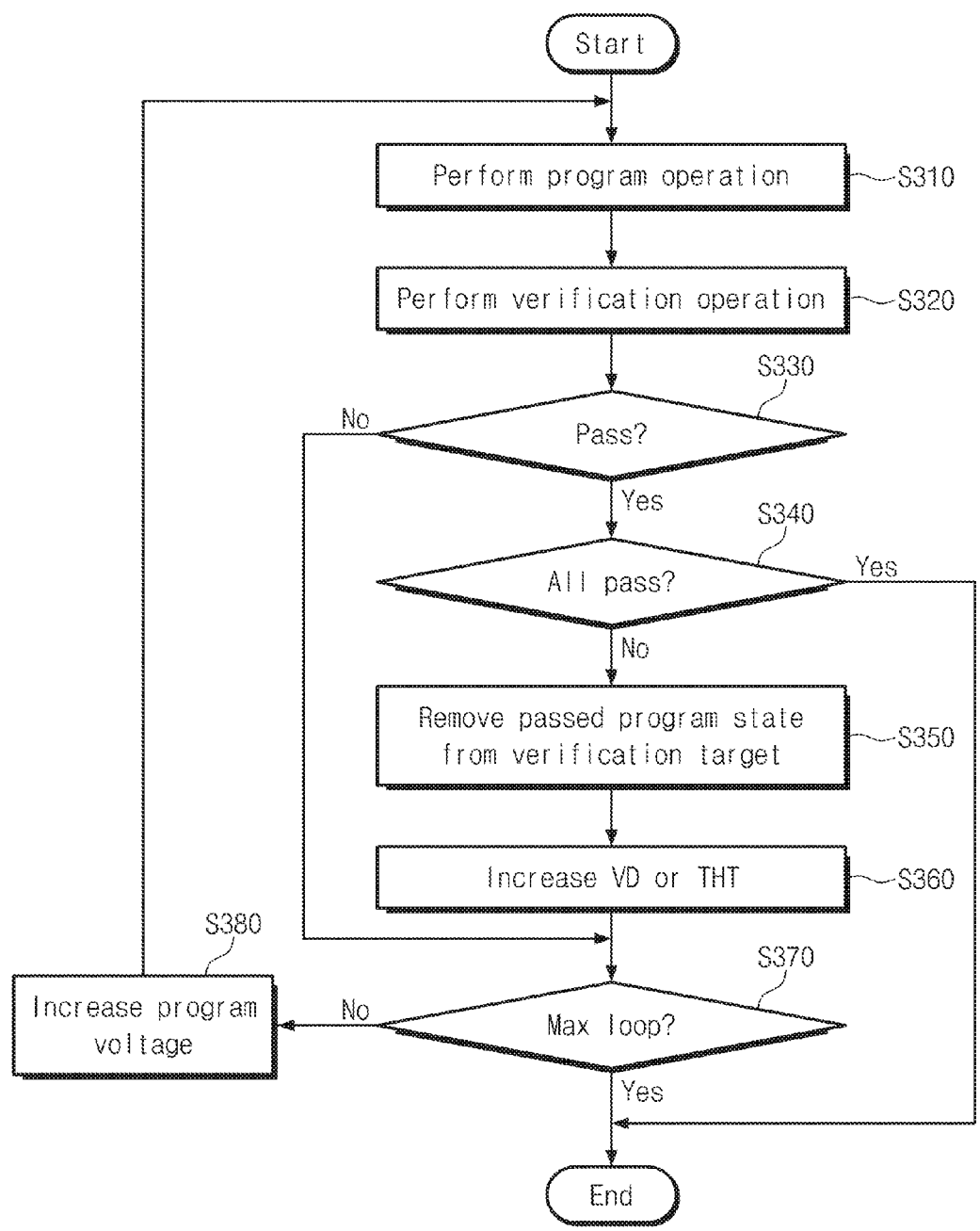
FIG. 13 is a flow chart illustrating an operating method of programming a nonvolatile memory, according to an exemplary embodiment of the inventive concept.

FIG. 13 is a flow chart schematically illustrating an operating method of programming the nonvolatile memory 110, according to an exemplary embodiment of the inventive concept. Referring to FIGS. 1, 2, and 13, in step S310, a program operation may be performed. For example, voltages of bit lines BL1 and BL2 may be adjusted based on data to be programmed in memory cells MC. A program voltage VPGM may be applied to a second word line WL2 connected to memory cells to be programmed, for example, second memory cells MC2, and pass voltages VPASS may be applied to first and third to six word lines WL1 and WL3 to WL6 connected to remaining memory cells, for example, first and third to sixth memory cells MC1 and MC3 to MC6.

Afterwards, voltages of the word lines WL1 to WL6 may be recovered using at least one of methods described with reference to FIGS. 4 and 7 to 10. For example, voltages of the word lines WL1 and WL3 to WL6 to which the pass voltages VPASS are applied may be recovered in the same manner as a first voltage V1, as described with reference to FIGS. 4 and 7 to 10. A voltage of the word line WL2 to which the program voltage VPGM is applied may be recovered in the same manner as a second voltage V2, as described with reference to FIGS. 4 and 7 to 10.

In step S320, a verification operation may be performed. For example, the bit lines BL1 and BL2 may be floated after a power supply voltage is applied to the bit lines BL1 and BL2. A verification voltage VF may be applied to the second word line WL2 to which the program voltage VPGM has been applied, and non-selection read voltages VREAD may be applied to the first and third to sixth word lines WL1 and WL3 to WL6 to which the pass voltages VPASS have been applied. Afterwards, threshold voltages of the second memory cells MC2 may be identified based on voltage variations of the bit lines BL1 and BL2 or the amount of current flowing through each of the bit lines BL1 and BL2.

In step S330, program pass or fail may be determined based on a result of identifying threshold voltages of the second memory cells MC2. For example, whether at least one of program states of the second memory cells MC2 is program passed may be determined. When the result of determining indicates program pass, in step S340, whether all program states are program passed may be determined. For example, in the case where the second memory cells MC2 are programmed to have seven program states, it may be determined whether the programming of the seven program states is passed. The method may end when the result of the determining indicates that the programming of the seven program states is passed.

When the result of determining indicates that the seven program states are not program-passed, the method proceeds to step S350. In this case, a program state that passed is excluded from a verification target. In other words, a program-passed program state may be excluded from a verification operation of a next program loop. Afterwards, in step S360, a voltage difference VD or a holding time THT may be adjusted, for example, increased.

Step S370 may be performed when the program pass is not determined in step S330. Step S370 may also be performed following step S360. In step S370, whether a program loop is a max loop may be determined. If a program loop is a max loop, the method may end. If a program loop is not a max loop, in step S380, the program voltage VPGM may increase. Afterwards, the method may return to step S310.

Figure 14:
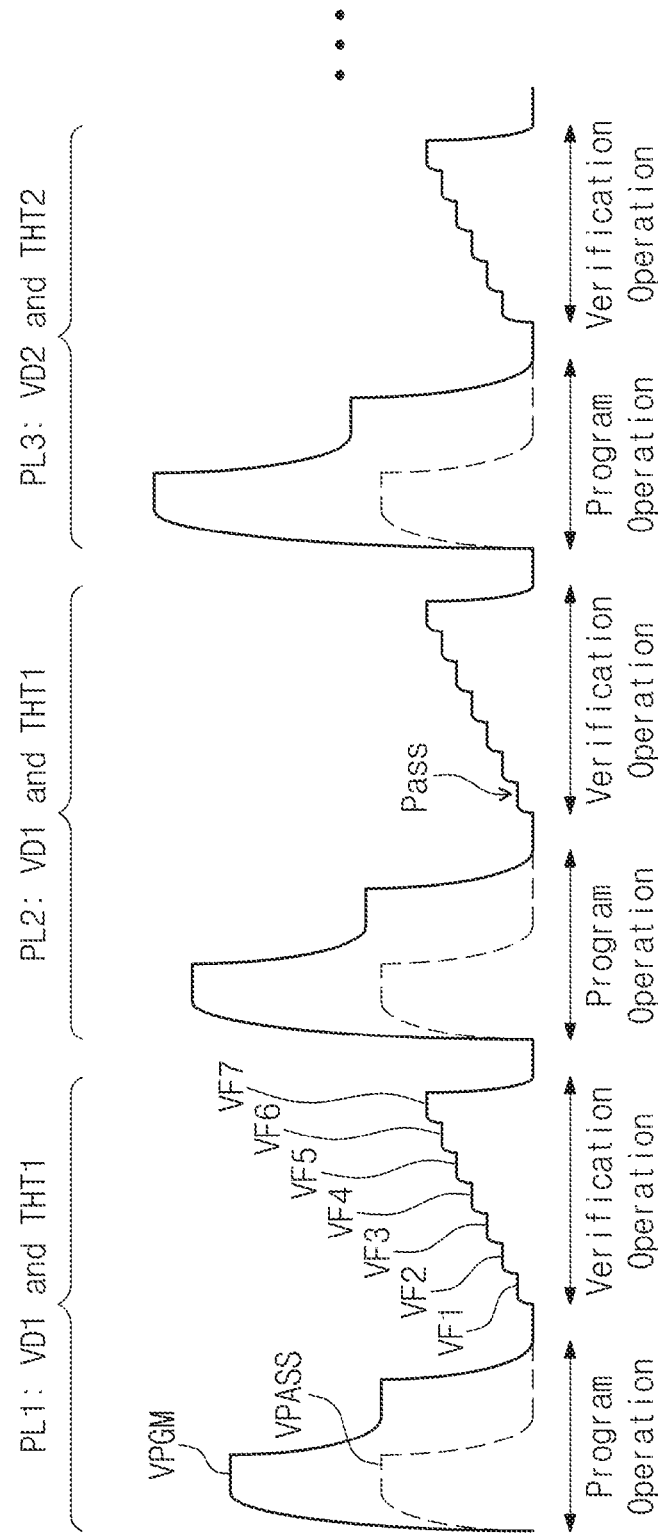
FIG. 14 is a graph for describing a method for adjusting a voltage difference or a holding time using an operating method illustrated in FIG. 13, according to an exemplary embodiment of the inventive concept.

FIG. 14 is a graph for describing a method for adjusting a voltage difference VD or a holding time THT using an operating method illustrated in FIG. 13, according to an exemplary embodiment of the inventive concept. In FIG. 14, a solid line shows a voltage variation of a selected word line (e.g., WL2) over time in a program operation, and a dotted line shows a voltage variation of an unselected word line (e.g., WL1) over time in a program operation. Referring to FIGS. 2 and 14, a program operation and a verification operation of a first program loop PL1 may be performed. In a program operation, a program voltage VPGM may be applied to the selected word line WL2, and a pass voltage VPASS may be applied to the unselected word line WL1. As described with reference to FIGS. 4 and 7 to 10, in a program recovery operation, a voltage of the selected word line WL2 and a voltage of the unselected word line WL1 may decrease to satisfy the following conditions: a first voltage difference VD1 and a first holding time THT1.

In a verification operation, first to seventh verification voltages VF1 to VF7 may be sequentially applied to the selected and unselected word lines WL2 and WL1. In an exemplary embodiment of the inventive concept, in the case where 3-bit data is programmed at each memory cell MC, the first to seventh verification voltages VF1 to VF7 may be used. As the number of bits to be programmed per cell is changed, the number of verification voltages VF may be also changed.

A level of a program voltage VPGM of a second program loop PL2 may be set to be higher than a level of a program voltage VPGM of the first program loop PL2. Furthermore, in the second program loop PL2, a voltage of the selected word line WL2 and a voltage of the unselected word line WL1 may increase to satisfy the following conditions: the first voltage difference VD1 and the first holding time THT1. In the second program loop PL2, a result of a verification operation using the first verification voltage VF1 may be determined as program pass.

A level of the program voltage VPGM of the third program loop PL3 may be set to be higher than that of the second program loop PL2. Since a result of a verification operation using the first verification voltage VF1 indicates program pass, a program recovery operation of the third program loop PL3 may be performed based on a second voltage difference VD2 and a second holding time THT2.

The second voltage difference VD2 may be greater than the first voltage difference VD1. The second holding time THT2 may be longer than the first holding time THT1. Furthermore, since a program state corresponding to the first verification voltage VF1 is excluded from a verification target, the first verification voltage VF1 may not applied in a verification operation.

In other words, a voltage difference VD or a holding time THT associated with a program recovery operation may be adjusted when at least one of a plurality of program states is determined as being program-passed.

Figure 15:
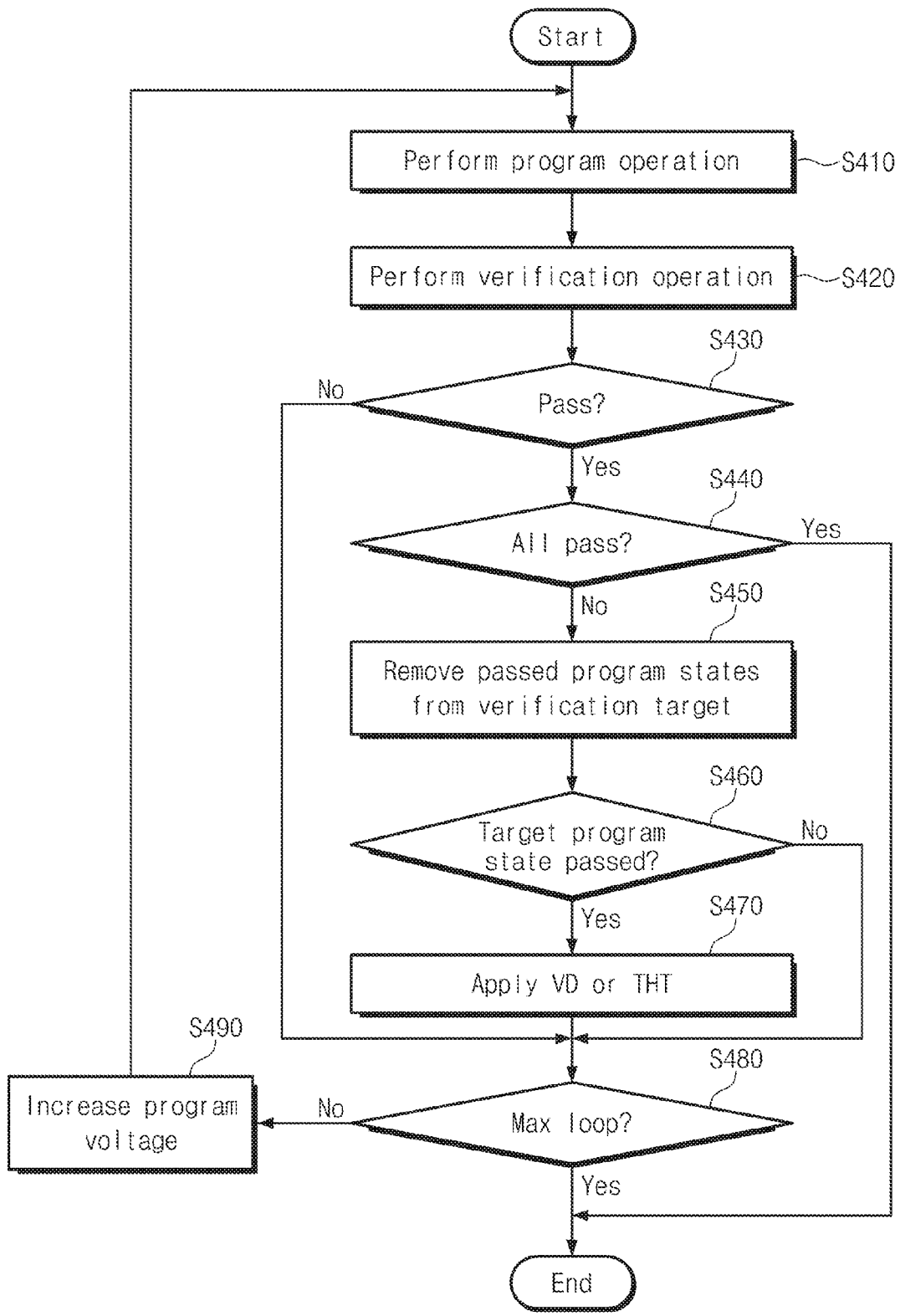
FIG. 15 is a flow chart illustrating an operating method of programming a nonvolatile memory, according to an exemplary embodiment of the inventive concept.

FIG. 15 is a flow chart illustrating an operating method of programming the nonvolatile memory 110, according to an exemplary embodiment of the inventive concept. Referring to FIGS. 1, 2, and 15, in step S410, a program operation may be performed. For example, voltages of bit lines BL1 and BL2 may be adjusted based on data to be programmed in memory cells MC. A program voltage VPGM may be applied to a second word line WL2 connected to memory cells to be programmed, for example, second memory cells MC2, and pass voltages VPASS may be applied to first and third to six word lines WL1 and WL3 to WL6 connected to remaining memory cells, for example, first and third to sixth memory cells MC1 and MC3 to MC6.

In step S420, a verification operation may be performed. For example, the bit lines BL1 and BL2 may be floated after a power supply voltage is applied to the bit lines BL1 and BL2. A verification voltage VF may be applied to the second word line WL2 to which the program voltage VPGM has been applied, and non-selection read voltages VREAD may be applied to the first and third to sixth word lines WL1 and WL3 to WL6 to which the pass voltages VPASS have been applied. Afterwards, threshold voltages of the second memory cells MC2 may be identified based on voltage variations of the bit lines BL1 and BL2 or the amount of current flowing through each of the bit lines BL1 and BL2.

In step S430, program pass or fail may be determined based on a result of identifying threshold voltages of the second memory cells MC2. For example, whether programming on at least one of the second memory cells MC2 is completed may be determined. When the result of the determining indicates program pass, in step S440, whether all program states are program passed may be determined. For example, in the case where the second memory cells MC2 are programmed to have seven program states, it may be determined whether the programming of the seven program states is passed. The method may end as the result of determining that the programming of the seven program states is passed.

As the result of determining that the seven program states are not program-passed, the method proceeds to step S450, in which a program state that passed is excluded from a verification target. In other words, a program-passed program state may be excluded from a verification operation of a next program loop.

In step S460, whether a target program state is program passed may be determined. When a program state determined as a program pass in step S430 includes a target program state, in step S470, a voltage difference VD and/or a holding time THT may be applied. For example, in a following program loop, voltages of the word lines WL1 to WL6 may be recovered using at least one of methods described with reference to FIGS. 4 and 7 to 10. For example, voltages of the word lines WL1 and WL3 to WL6 to which the pass voltage VPASS is applied may be recovered in the same manner as a first voltage V1, as described with reference to FIGS. 4 and 7 to 10. A voltage of the word line WL2 to which the program voltage VPGM is applied may be recovered in the same manner as a second voltage V2, as described with reference to FIGS. 4 and 7 to 10.

Step S480 may be performed when the program pass is not determined in step S430. Step S480 may also be performed following step S470. In step S480, whether a program loop is a max loop may be determined. If a program loop is a max loop, the method may end. If a program loop is not a max loop, in step S490, the program voltage VPGM may increase. Afterwards, the method may return to step S410.

Figure 16:
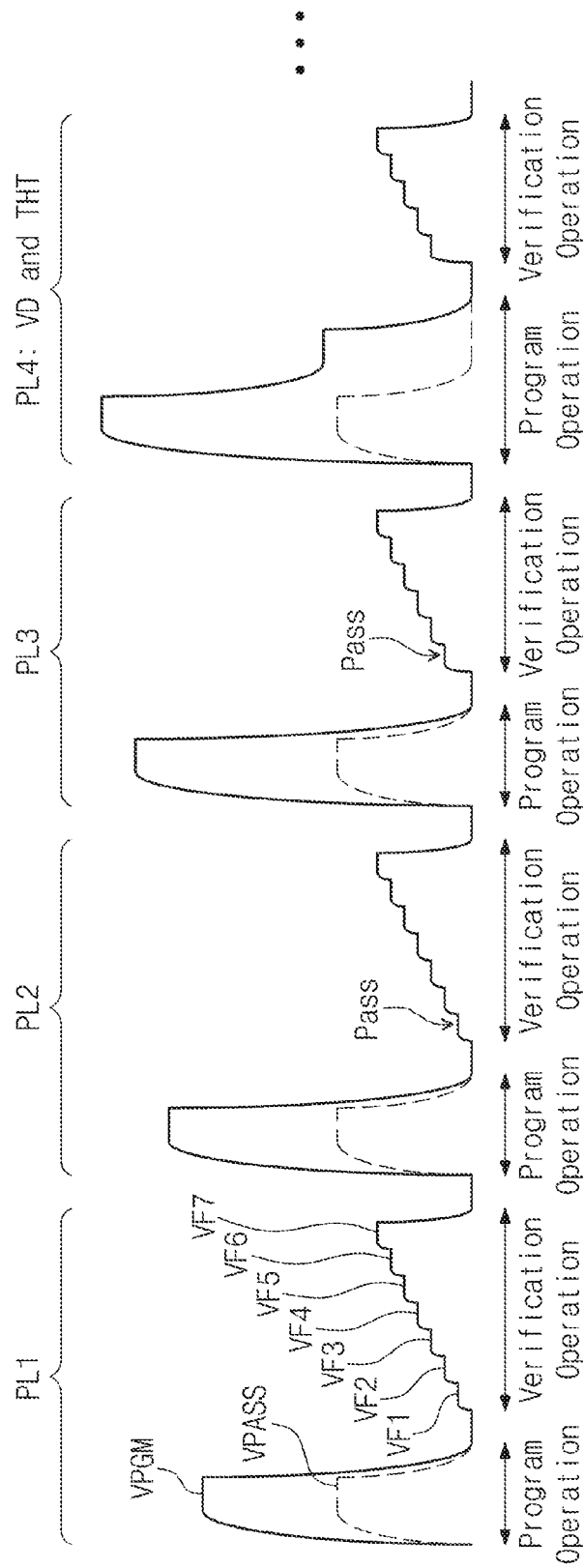
FIG. 16 is a graph for describing a method for adjusting a voltage difference or a holding time using an operating method illustrated in FIG. 15, according to an exemplary embodiment of the inventive concept.

FIG. 16 is a graph for describing a method for adjusting a voltage difference VD or a holding time THT using an operating method illustrated in FIG. 15, according to an exemplary embodiment of the inventive concept. In FIG. 16, a solid line shows a voltage variation of a selected word line (e.g., WL2) over time in a program operation, and a dotted line shows a voltage variation of an unselected word line (e.g., WL1) over time in a program operation. Referring to FIGS. 2 and 16, a program operation and a verification operation of a first program loop PL1 may be performed. In a program operation, a program voltage VPGM may be applied to the selected word line WL2, and a pass voltage VPASS may be applied to the unselected word line WL1. As described with reference to FIGS. 4 and 7 to 10, in a program recovery operation, a voltage of the selected word line WL2 and a voltage of the unselected word line WL1 may decrease to satisfy the following conditions: a first voltage difference VD1 and a first holding time THT1.

In a verification operation, first to seventh verification voltages VF1 to VF7 may be sequentially applied to the selected and unselected word lines WL2 and WL1. In an exemplary embodiment of the inventive concept, in the case where 3-bit data is programmed at each memory cell MC, the first to seventh verification voltages VF1 to VF7 may be used. As the number of bits to be programmed per cell is changed, the number of verification voltages VF may be also changed.

A level of a program voltage VPGM of a second program loop PL2 may be set to be higher than a level of a program voltage VPGM of the first program loop PL2. In the second program loop PL2, a result of a verification operation using the first verification voltage VF1 may be determined as program pass.

A level of the program voltage VPGM of the third program loop PL3 may be set to be higher than that of the second program loop PL2. Since a result of a verification operation using the first verification voltage VF1 indicates program pass, a program state corresponding to the first verification voltage VF1 may be excluded from a verification target. In other words, the first verification voltage VF1 may not be applied in a verification operation. In a third program loop PL3, a result of a verification operation using a second verification voltage VF2 may be determined as being program pass. In an exemplary embodiment of the inventive concept, a program state corresponding to the second verification voltage VF2 may be a target program state. Accordingly, a voltage difference VD or a holding time THT described with reference to FIGS. 4 and 7 to 10 may be applied to a program loop following the third program loop PL3.

A level of the program voltage VPGM of a fourth program loop PL4 may be set to be higher than that of the third program loop PL3. As described with reference to FIGS. 4 and 7 to 10, in a program recovery operation, voltages of the selected and unselected word lines WL2 and WL1 may decrease to satisfy the following conditions: a first voltage difference VD1 and a first holding time THT1.

Since a result of a verification operation using the second verification voltage VF2 in the third program loop PL3 indicates program pass, a program state corresponding to the second verification voltage VF2 may be excluded from a verification target. In other words, the second verification voltage VF2 may not be applied at a verification operation.

In other words, a program recovery operation described with reference to FIGS. 4 and 7 to 10 may be performed after a target program state of a plurality of program states is program-passed.

The exemplary embodiment of the inventive concept described with reference to FIGS. 11 and 12, the exemplary embodiment of the inventive concept described with reference to FIGS. 13 and 14, and the exemplary embodiment of the inventive concept described with reference to FIGS. 15 and 16 may be combined. Like the exemplary embodiment of the inventive concept described with reference to FIGS. 15 and 16, a program recovery operation described with reference to FIGS. 4 and 7 to 10 may be performed after a target program state is determined as being program-passed. In the program recovery operation, a voltage difference VD or a holding time THT may be adjusted as a program loop is performed as described with reference to FIGS. 11 and 12. Furthermore, in the program recovery operation, a voltage difference VD or a holding time THT may be adjusted as program pass is determined as described with reference to FIGS. 13 and 14.

Figure 17:
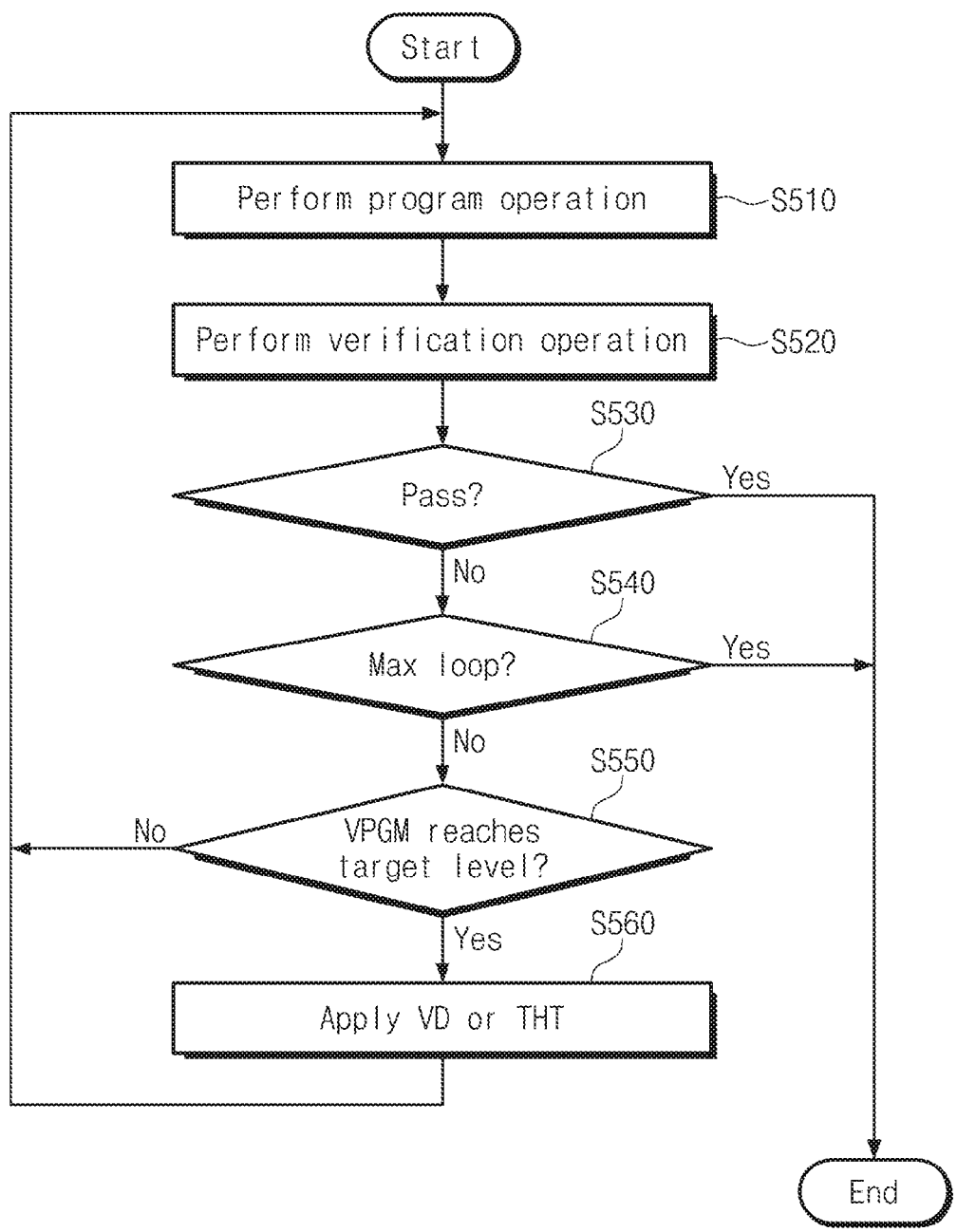
FIG. 17 is a flow chart illustrating an operating method of programming a nonvolatile memory, according to an exemplary embodiment of the inventive concept.

FIG. 17 is a flow chart illustrating an operating method of programming the nonvolatile memory 110, according to an exemplary embodiment of the inventive concept. Referring to FIGS. 1, 2, and 17, in step S510, a program operation may be performed. For example, voltages of bit lines BL1 and BL2 may be adjusted based on data to be programmed in memory cells MC. A program voltage VPGM may be applied to a second word line WL2 connected to memory cells to be programmed, for example, second memory cells MC2, and pass voltages VPASS may be applied to first and third to six word lines WL1 and WL3 to WL6 connected to remaining memory cells, for example, first and third to sixth memory cells MC1 and MC3 to MC6.

In step S520, a verification operation may be performed. For example, the bit lines BL1 and BL2 may be floated after a power supply voltage is applied to the bit lines BL1 and BL2. A verification voltage VF may be applied to the second word line WL2 to which the program voltage VPGM has been applied, and non-selection read voltages VREAD may be applied to the first and third to sixth word lines WL1 and WL3 to WL6 to which the pass voltages VPASS have been applied. Afterwards, threshold voltages of the second memory cells MC2 may be identified based on voltage variations of the bit lines BL1 and BL2 or the amount of current flowing through each of the bit lines BL1 and BL2.

In step S530, program pass or fail may be determined based on a result of identifying threshold voltages of the second memory cells MC2. For example, whether programming of program states of the second memory cells MC2 is completed may be determined. When the result of this determining indicates program pass, the method may end. When the result of this determining indicates program fail, the method may proceed to step S540.

In step S540, whether a program loop is a max loop may be determined. If a program loop is a max loop, the method may end. If a program loop is not a max loop, the method proceeds to step S550.

In step S550, whether the program voltage VPGM reaches a target level may be determined. For example, whether a level of the program voltage VPGM used in the program operation of step S510 reaches a target level may be determined. If a level of the program voltage VPGM reaches the target level, in step S560, a voltage difference VD and/or a holding time THT may be applied. In other words, in a following program loop, voltages of the word lines WL1 to WL6 may be recovered using at least one of methods described with reference to FIGS. 4 and 7 to 10. For example, voltages of the word lines WL1 and WL3 to WL6 to which the pass voltage VPASS is applied may be recovered in the same manner as a first voltage V1, as described with reference to FIGS. 4 and 7 to 10. A voltage of the word line WL2 to which the program voltage VPGM is applied may be recovered in the same manner as a second voltage V2, as described with reference to FIGS. 4 and 7 to 10.

In other words, when the program voltage VPGM reaches the target level, there may be performed a program recovery operation described with reference to FIGS. 4 and 7 to 10. A graph corresponding to an operating method illustrated in FIG. 17 may be similar to that illustrated in FIG. 16, and a description thereof is thus omitted.

Like the exemplary embodiment of the inventive concept described with reference to FIG. 17, a program recovery operation described with reference to FIGS. 4 and 7 to 10 may be performed after a program voltage reaches a target level. In the program recovery operation, a voltage difference VD or a holding time THT may be adjusted as a program loop is performed as described with reference to FIGS. 11 and 12. Furthermore, in the program recovery operation, a voltage difference VD or a holding time THT may be adjusted as program pass is determined as described with reference to FIGS. 13 and 14.

FIG. 18 is a diagram for describing how voltage differences VD and holding times of word lines WL1 to WL6 are adjusted, according to an exemplary embodiment of the inventive concept. Referring to FIG. 18, initialization values of voltage differences VD corresponding to first to sixth word lines WL1 to WL6 may be first to sixth voltage differences VD1 to VD6, respectively. Increments of the voltage differences VD corresponding to the first to sixth word lines WL1 to WL6 may be first to sixth voltage increments VDU to VDI6, respectively. For example, in a program operation, a k-th word line WLk (k being a positive integer) may be selected. In this case, an initialization value of a voltage difference VD between a selected word line WLk and an unselected word line may be a k-th voltage difference VDk. Furthermore, when a voltage difference VD is adjusted using an exemplary embodiment of the inventive concept described with reference to FIGS. 11 and 12 or an exemplary embodiment of the inventive concept described with reference to FIGS. 13 and 14, a voltage difference VD between a selected word line WLk and an unselected word line may be adjusted by the k-th voltage increment VDIk.

Initialization values of holding times THT corresponding to the first to sixth word lines WL1 to WL6 may be first to sixth holding times THT1 to THT6, respectively. Increments of the holding times THT corresponding to the first to sixth word lines WL1 to WL6 may be first to sixth time increments THTI1 to THTI6, respectively. For example, in a program operation, a k-th word line WLk (k being a positive integer) may be selected. In this case, an initialization value of a holding time THT when a voltage difference VD between a selected word line WLk and an unselected word line is maintained may be a k-th holding time THTk. Furthermore, when a holding time THT is adjusted using an exemplary embodiment of the inventive concept described with reference to FIGS. 11 and 12 or an exemplary embodiment of the inventive concept described with reference to FIGS. 13 and 14, a holding time THT may be adjusted by the k-th time increment THTk.

In an exemplary embodiment of the inventive concept, with regard to the first to sixth word lines WL1 to WL6, the first to sixth voltage differences VD1 to VD6, the first to sixth voltage increments VDU to VDI6, the first to sixth holding times THT1 to THT6, and the first to sixth time increments THTI1 to THTI6 may be determined based on characteristics of first to sixth memory cells MC1 to MC6 connected to the first to sixth word lines WL1 to WL6. For example, the first to sixth voltage differences VD1 to VD6, the first to sixth voltage increments VDU to VDI6, the first to sixth holding times THT1 to THT6, and the first to sixth time increments THTI1 to THTI6 may be determined based on operating characteristics, such as a size, a program speed, an erase speed, and the like associated with the first to sixth memory cells MC1 to MC6.

FIG. 19 is a diagram for describing how voltage differences VD and holding times of word lines WL1 to WL6 are adjusted, according to an exemplary embodiment of the inventive concept. Referring to FIG. 19, first to sixth word lines WL1 to WL6 may be divided into word line groups. For example, the first and second word lines WL1 and WL2 may form a first word line group, the third and fourth word lines WL3 and WL4 may form a second word line group, and the fifth and sixth word lines WL5 and WL6 may form a third word line group. An initialization value of a voltage difference VD, an increment of the voltage difference VD, an initialization value of a holding time THT, and an increment of the holding time THT may be determined by the word line group.

For example, a first voltage difference VD1, a first voltage increment VDI1, a first holding time THT1, and a first time increment THTI1 may be applied to the first and second word lines WL1 and WL2 of the first word line group. A second voltage difference VD2, a second voltage increment VDI2, a second holding time THT2, and a second time increment THTI2 may be applied to the third and fourth word lines WL3 and WL4 of the second word line group. A third voltage difference VD3, a third voltage increment VDI3, a third holding time THT3, and a third time increment THTI3 may be applied to the fifth and sixth word lines WL5 and WL6 of the third word line group.

In an exemplary embodiment of the inventive concept, with regard to the first to sixth word lines WL1 to WL6, the first to third voltage differences VD1 to VD3, the first to third voltage increments VDI1 to VDI3, the first to third holding times THT1 to THT3, and the first to third time increments THTI1 to THTI3 may be determined based on characteristics of first to sixth memory cells MC1 to MC6 connected to the word lines WL1 to WL6. For example, the first to third voltage differences VD1 to VD3, the first to third voltage increments VDI1 to VDI3, the first to third holding times THT1 to THT3, and the first to third time increments THTI1 to THTI3 may be determined based on operating characteristics, such as a size, a program speed, an erase speed, and the like associated with the first to sixth memory cells MC1 to MC6.

Figure 20:
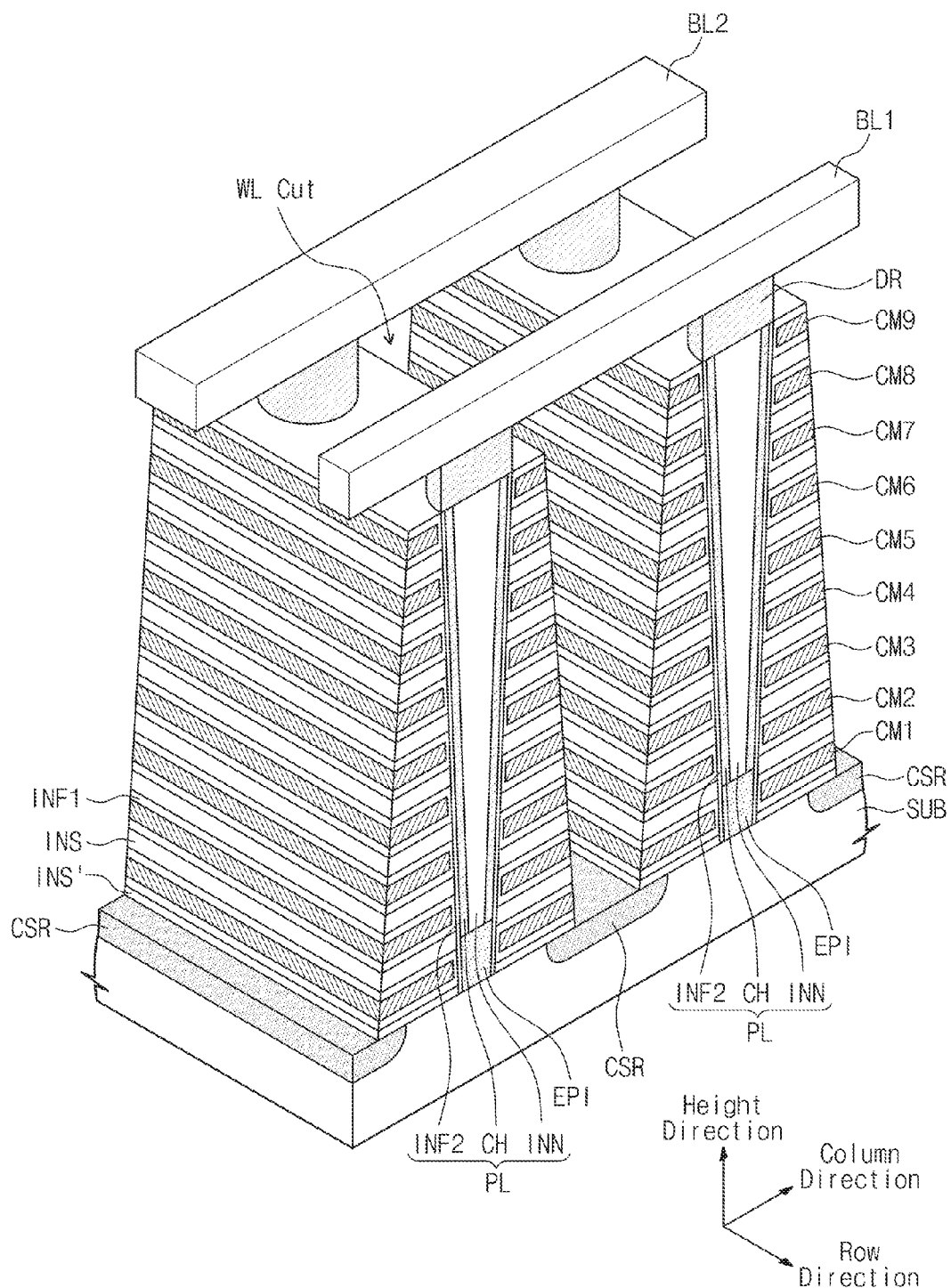
FIG. 20 is a perspective view illustrating a structure of a memory block illustrated in FIG. 2, according to an exemplary embodiment of the inventive concept.

FIG. 20 is a perspective view illustrating a structure of a memory block BLKa illustrated in FIG. 2, according to an exemplary embodiment of the inventive concept. Referring to FIGS. 2 and 20, a plurality of common source regions CSR extending along a row direction may be provided in a substrate SUB. The common source regions CSR may be spaced apart from each other along a column direction. The common source regions CSR may be connected in common to form a common source line. In an exemplary embodiment of the inventive concept, the substrate SUB may include a p-type semiconductor material (e.g., silicon). The common source regions CSR may include an n-type semiconductor material.

Between the common source regions CSR, a plurality of insulation materials INS and INS' may be provided sequentially on the substrate SUB along a height direction (e.g., a direction perpendicular to the substrate SUB). The insulation materials INS and INS' may be spaced apart from each other along the height direction. The insulation materials INS and INS' may include an insulation material such as semiconductor oxide or silicon nitride. The insulation material INS' contacting with the substrate SUB may be thinner in thickness (e.g., a height-directional thickness) than the other insulation materials INS.

Between the common source regions CSR, a plurality of pillars PL may be arranged to be spaced apart from each other along the row direction and the column direction and may penetrate the plurality of insulation materials INS and INS' along the height direction. In an exemplary embodiment of the inventive concept, the pillars PL may contact with a silicon layer EPI on the substrate SUB through the insulation materials INS and INS'. For example, the silicon layer EPI may be grown from the substrate SUB using a selective epitaxial growth technology. The silicon layer EPI may protrude from the substrate SUB toward a direction perpendicular to the substrate SUB at positions of the pillars PL. The silicon layer EPI may be intrinsic or p-type.

Each of the pillars PL may include an insulation film INF2, a channel film CH, and an inner material INN. The insulation films INF2 may include at least two different insulation films such as silicon oxide, silicon nitride, and the like. The channel films CH may include p-type silicon or intrinsic silicon, respectively. The inner materials INN may include an insulation material or an air gap, respectively.

Between the common source regions CSR, insulation films INF1 may be provided on upper and lower surfaces of the insulation layers INS and INS' and external exposed surfaces of the pillars PL. Insulation films INF1 provided on an upper surface of an insulation material, placed at the highest height, from among the insulation layers INS and INS' may be removed. The insulation films INF1 may include at least one insulation film, such as silicon oxide, aluminum oxide, or the like.

Between the common source regions CSR and between the insulation layers INS and INS', there may be provided conductive materials CM1 and CM9 on external exposed surfaces of the insulations films INF1. The conductive materials CM1 and CM9 may include a metal material, respectively.

A plurality of drains DR may be provided on the pillars PL, respectively. In an exemplary embodiment of the inventive concept, each of the drains DR may include an n-type semiconductor material (e.g., silicon). In an exemplary embodiment of the inventive concept, the drains DR may contact with upper surfaces of the channel films CH of the pillars PL.

Bit lines BL1 and BL2 may be respectively provided on the drains DR. The bit lines BL1 and BL2 may extend along the row direction and may be spaced apart from each other. The bit lines BL1 and BL2 may be connected to the drains DR. In an exemplary embodiment of the inventive concept, the drains DR and the bit lines BL1 and BL2 may be connected through contact plugs, respectively. The bit lines BL1 and BL2 may include metal materials.

The pillars PL may form a plurality of cell strings CS11, CS12, CS21, and CS22 together with the insulation films INF1 and INF2 and the conductive materials CM1 to CM6. Each pillar PL may form a cell string together with the insulation films INF1 and INF2 and adjacent conductive materials CM1 to CM9. Cell strings arranged in the column direction may be separated from each other by a wordline cut WL Cut, for example.

A pillar PL and a conductive material CM corresponding thereto may form a cell transistor. For example, the conductive material CM may act as a control gate. The insulation films INF1 and INF2 placed between the conductive material CM and the channel film CH of the pillar PL may have an oxide-nitride-oxide (ONO) or oxide-nitride-oxide-aluminum (ONOA) structure. The insulation film INF1 may form a blocking insulation film. A silicon nitride film of the insulation film INF2 may form a charge trap film. A silicon oxide film of the insulation film INF2 may form a tunneling insulation film. In other words, one conductive material CM and a pillar PL corresponding thereto may form a charge trap type cell transistor.

First conductive materials CM1 may act as control gates of ground selection transistors GST, respectively. Insulation films INF1 and INF2 corresponding to the first conductive materials CM1 may form charge trap layers of the ground selection transistors GST. The channel films CH corresponding to the first conductive materials CM1 may act as vertical bodies of the ground selection transistors GST.

The first conductive material CM1 of a first row may form a ground selection line GSL1. The first conductive material CM1 of a second row may form a ground selection line GSL2.

Second to sixth conductive materials CM2 to CM7 may act as control gates of first to sixth memory cells MC1 to MC6, respectively. Insulation films INF1 and INF2 corresponding to the second to sixth conductive materials CM2 to CM7 may act as charge trap layers of the first to sixth memory cells MC1 to MC6, respectively. Channel films CH corresponding to the second to sixth conductive materials CM2 to CM7 may act as vertical bodies of the first to sixth memory cells MC1 to MC6, respectively.

Second conductive materials CM2 may be connected in common to form a first word line WL1. Third conductive materials CM3 may be connected in common to form a second word line WL2. Fourth conductive materials CM4 may be connected in common to form a third word line WL3. Fifth conductive materials CM5 may be connected in common to form a fourth word line WL4. Sixth conductive materials CM6 may be connected in common to form a fifth word line WL5. Seventh conductive materials CM7 may be connected in common to form a sixth word line WL6.

Eighth and ninth conductive materials CM8 and CM9 may act as control gates of string selection transistors SSTa and SSTb, respectively. Insulation films INF1 and INF2 corresponding to the eighth and ninth conductive materials CM8 and CM9 may act as charge trap layers of the string selection transistors SSTa and SSTb, respectively. Channel films CH corresponding to the eighth and ninth conductive materials CM8 and CM9 may act as vertical bodies of the string selection transistors SSTa and SSTb, respectively.

The eight conductive material CM8 of a first row may form a string selection line SSL1a. The ninth conductive material CM9 of the first row may form a string selection line SSL1b. The eight conductive material CM8 of a second row may form a string selection line SSL2a. The ninth conductive material CM9 of the second row may form a string selection line SSL2b.

Figure 21:
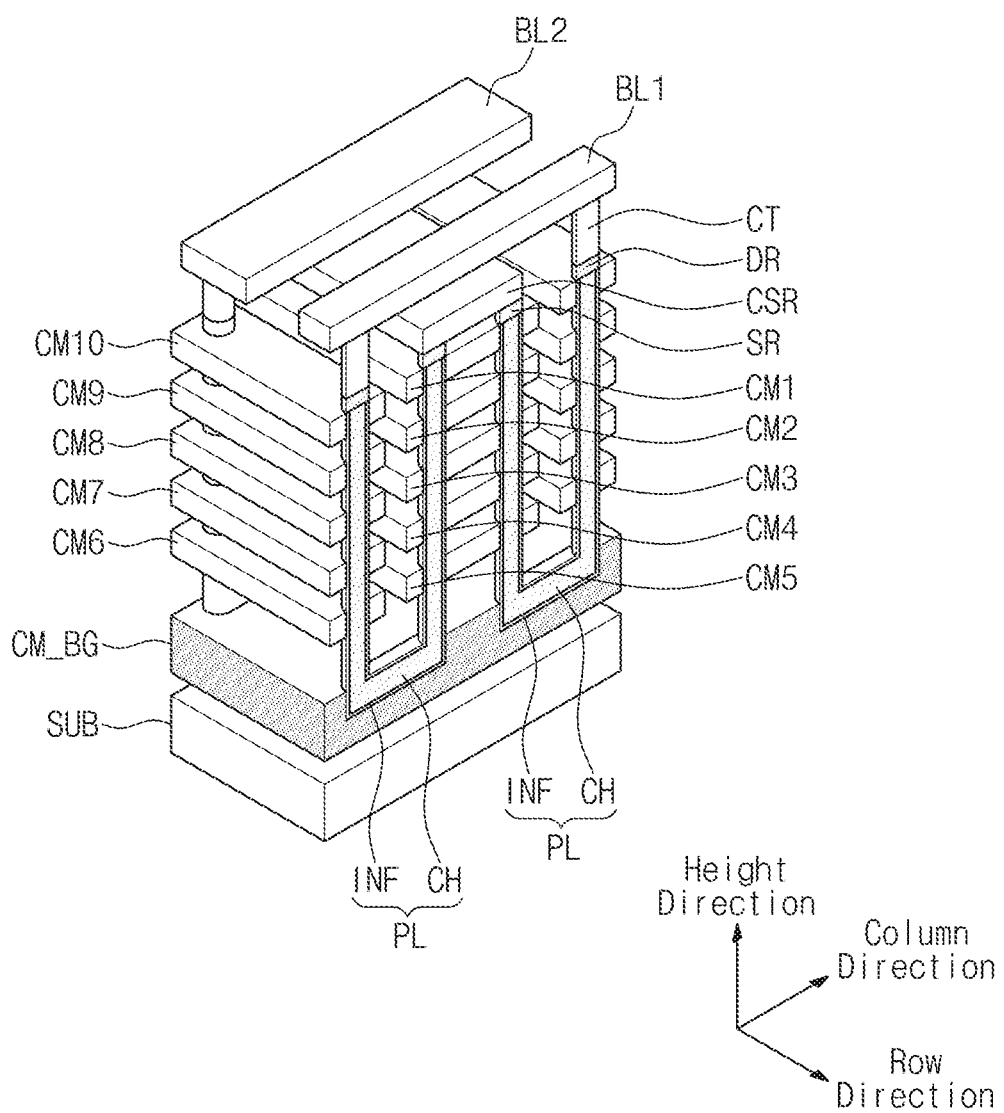
FIG. 21 is a perspective view of a memory block illustrated in FIG. 2, according to an exemplary embodiment of the inventive concept.

FIG. 21 is a perspective view of a memory block BLKa illustrated in FIG. 2, according to an exemplary embodiment of the inventive concept. Referring to FIGS. 2 and 21, a conductive material CM_BG of a plate shape extending along a row direction and a column direction may be provided on a substrate SUB. The conductive material CM_BG may be electrically separated from the substrate SUB.

At each row on the conductive material CM_BG, there may be provided first and second groups of conductive materials extending along a row direction and spaced apart from each other along a column direction. Conductive materials in the first group may include a plurality of conductive materials CM6 to CM10 stacked on the substrate SUB in a direction perpendicular to the substrate SUB. The conductive materials CM6 to CM10 may be spaced apart from each other along a height direction. The conductive materials CM6 to CM10 may be spaced apart from the conductive material CM_BG along the height direction.

Conductive materials in the second group may include a plurality of conductive materials CM1 to CM5 stacked on the substrate SUB in a direction perpendicular to the substrate SUB. The conductive materials CM1 to CM5 may be spaced apart from each other along a height direction. The conductive materials CM1 to CM5 may be spaced apart from the conductive material CM_BG along the height direction.

At each row on the conductive material CM_BG, there may be provided pillars PL spaced apart from each other along the row direction. Each pillar PL may extend toward an inner space of the conductive material CM_BG along the height direction, perpendicular to the substrate SUB, through the first to fifth conductive materials CM1 to CM5. Furthermore, each pillar PL may extend toward an inner space of the conductive material CM_BG along the height direction, perpendicular to the substrate SUB, through the sixth to tenth conductive materials CM6 to CM10. Each pillar PL may extend in a column direction at an inner space of the conductive material CM_BG, and a portion of each pillar PL penetrating the conductive materials CM1 to CM5 and a portion of each pillar PL penetrating the conductive materials CM6 to CM10 may be connected to each other.

Each pillar PL may include an insulation film INF and a channel film CH. The insulation film INF may form a charge trap layer. The insulation film INF may include ONO or ONOA. The channel film CH may form an active region.

In each pillar PL, a portion penetrating the conductive materials CM1 to CM5 may be connected to a common source region CSR through a source region SR along a height direction. The source region SR may include an n-type semiconductor, for example, silicon. The common source region CSR may include a metal material or a semiconductor.

In each pillar PL, a portion penetrating the conductive materials CM6 to CM10 may be connected to a bit line BL (BL1 or BL2) through a drain region DR and a contact CT along the height direction. The drain region DR may include an n-type semiconductor, for example, silicon. The common source region CSR may include a metal material or a semiconductor.

As described with reference to FIG. 20, a common source region CSR may form a common source line CSL. In each pillar PL, each of first to tenth conductive materials CM1 to CM10 may correspond to a ground selection line GSL, a word line WL, or a string selection line SSL. For example, at least one conductive material adjacent to the common source region CSR may form a ground selection line. At least one conductive material adjacent to the drain region DR may form a string selection line. Conductive materials placed between a conductive material forming at least one string selection line and a conductive material forming at last one ground selection line may form word lines, respectively. At least one ground selection line may form at least one ground selection transistor together with a pillar PL. At least one string selection line may form at least one string selection transistor together with a pillar PL. The word lines may form memory cells together with the pillar PL, respectively. The conductive material CM_BG may act as a pass gate that that forms a channel at a bent portion of each pillar PL.

Figure 22:
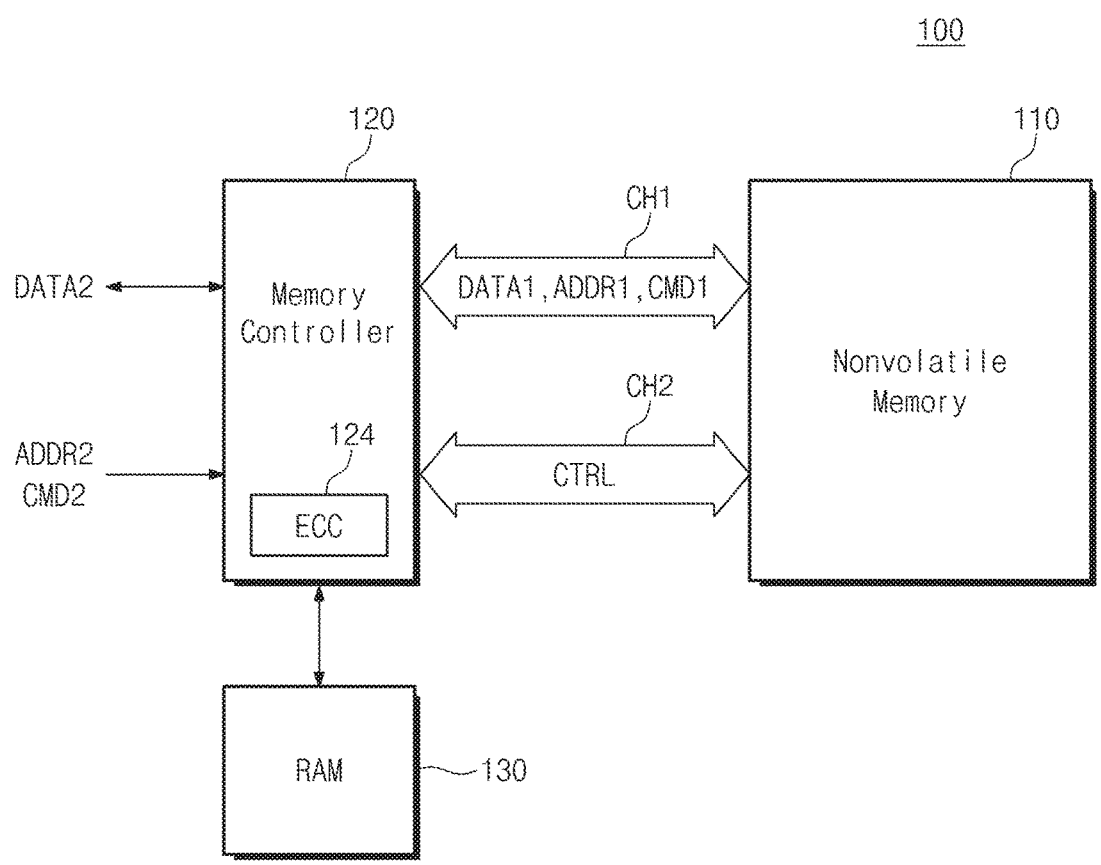
FIG. 22 is a block diagram illustrating a storage device according to an exemplary embodiment of the inventive concept.

FIG. 22 is a block diagram illustrating a storage device 100 according to an exemplary embodiment of the inventive concept. Referring to FIG. 22, the storage device 100 may contain a nonvolatile memory 110, a memory controller 120, and a RAM 130.

The nonvolatile memory 110 may perform read, write, and erase operations according to a control of the memory controller 120. The nonvolatile memory 110 may exchange first data DATA1 with the memory controller 120. For example, the nonvolatile memory 110 may receive write data from the memory controller 120 and store the write data. The nonvolatile memory 110 may perform a read operation and output the first data DATA1 to the memory controller 120 as a result of the read operation.

The nonvolatile memory 110 may receive a first command CMD1 and a first address ADDR1 from the memory controller 120. The nonvolatile memory 110 may exchange a control signal CTRL with the memory controller 120. For example, the nonvolatile memory 110 may receive, from the memory controller 120, at least one of a chip enable signal/CE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, and a read enable signal/RE which instructs the nonvolatile memory 110 to perform a read operation. The read enable signal/RE may be periodically toggled and used to tune timing. The nonvolatile memory 110 may further receive a write enable signal/WE activated by the memory controller 120 when the first command CMD1 or the first address ADDR1 is transmitted, a write protection signal/WP activated by the memory controller 120 to prevent unintended writing or erasing when a power changes, and a data strobe signal DQS that the memory controller 120 generates in a write operation. The data strobe signal DQS may be periodically toggled and used to adjust synchronization of the first data DATA1. For example, the nonvolatile memory 110 may output, to the memory controller 120, at least one of a ready/busy signal R/nB indicating whether the nonvolatile memory 110 is performing a program, erase or read operation and a data strobe signal DQS. The data strobe signal DQS generated by the nonvolatile memory 110 based on the read enable signal/RE, is periodically toggled, and is used to adjust output synchronization of the first data DATA1.

In an exemplary embodiment of the inventive concept, the first data DATA1, the first address ADDR1, and the first command CMD1 may be exchanged between the memory controller 120 and the nonvolatile memory 110 through a first channel CH1. The control signal CTRL may be exchanged between the memory controller 120 and the nonvolatile memory 110 through a second channel CH2. The second channel CH2 may be a control channel.

The nonvolatile memory 110 may be configured to perform a program recovery operation described with reference to FIGS. 1 to 19.

The nonvolatile memory 110 may include a flash memory. However, the inventive concept may not be limited thereto. For example, the nonvolatile memory 110 may include a nonvolatile memory, such as a PRAM, an MRAM, an RRAM, and an FRAM.

The memory controller 120 may be configured to control the nonvolatile memory 110. For example, the nonvolatile memory 110 may perform a write, read, or erase operation according to a control of the memory controller 120. The memory controller 120 may exchange the first data DATA1 and the control signal CTRL with the nonvolatile memory 110 and may output the first command CMD1 and the first address ADDR1 to the nonvolatile memory 110.

The memory controller 120 may control the nonvolatile memory 110 in response to a control of an external host device. The memory controller 120 may exchange second data DATA2 with the host device and may receive a second command CMD2 and a second address ADDR2 from the host device.

In an exemplary embodiment of the inventive concept, the memory controller 120 may exchange the first data DATA1 with the nonvolatile memory 110 by a first unit (e.g., a time unit or a data unit), and the memory controller 120 may exchange the second data DATA2 with the host device by a second unit (e.g., a time unit or a data unit) different from the first unit.

Based on a first format, the memory controller 120 may exchange the first data DATA1 with the nonvolatile memory 110 and may transmit the first command CMD1 and the first address ADDR1 to the nonvolatile memory 110. Based on a second format different from the first format, the memory controller 120 may exchange the second data DATA2 with the host device and may receive the second command CMD2 and the second address ADDR2 from the host device.

The memory controller 120 may use the RAM 130 as a working memory, a buffer memory, or a cache memory. For example, the memory controller 120 may receive the second data DATA2 from the host device and may store the second data DATA2 in the RAM 130. The memory controller 120 may write the second data DATA2 stored in the RAM 130 in the nonvolatile memory 110 as the first data DATA1. The memory controller 120 may read the first data DATA1 from the nonvolatile memory 110 and may store the first data DATA1 thus read in the RAM 130. The memory controller 120 may output the first data DATA1 stored in the RAM 130 to the host device as the second data DATA2. The memory controller 120 may store data read from the nonvolatile memory 110 in the RAM 130 and may write the data stored in the RAM 130 back in the nonvolatile memory 110.

The memory controller 120 may store data or code, which is used to manage the nonvolatile memory 110, in the RAM 130. For example, the memory controller 120 may read data or code, which is used to manage the nonvolatile memory 110, from the nonvolatile memory 110 and may load the read data or code on the RAM 130 for driving.

The memory controller 120 may include an error-correcting code (ECC) block 124. The ECC block 124 may generate parities based on first data DATA1 to be written in the nonvolatile memory 110. The parities thus generated may be written in the nonvolatile memory 110 together with the first data DATA1. A parity generating operation may be an error correction encoding operation. The ECC block 124 may receive the first data DATA1 and parity from the nonvolatile memory 110. The ECC block 124 may correct an error of the first data DATA1 using the parity. An error correcting operation may be an error correction decoding operation.

In an exemplary embodiment of the inventive concept, in an error correction decoding operation, the ECC block 124 may perform simplified error correction or perfect error correction. The simplified error correction may be error correction having a reduced error correction time. The perfect error correction may be error correction having more reliability. The ECC block 124 may perform the simplified error correction or perfect error correction, thereby increasing reliability and operating speed of the storage device 100.

The RAM 130 may include at least one of a variety of random access memories, such as, but not limited to, a static RAM (SRAM), a dynamic RAM (DRAM), a synchronous DRAM (SDRAM), a PRAM, an MRAM, an RRAM, and an FRAM.

The storage device 100 may perform address mapping to reduce overhead due to an erase operation of the nonvolatile memory 110. For example, when overwriting is requested from the external host device, the storage device 100 may not erase memory cells, in which old data is stored, to store overwrite-requested data in erased memory cells. Instead, the storage device 100 may store the overwrite-requested data in memory cells of a free storage space. The memory controller 120 may drive a flash translation layer (FTL) that is used to map logical addresses for the external host device onto physical addresses for the nonvolatile memory 110 according to the above-described method. For example, the second address ADDR2 may be a logical address, and the first address ADDR1 may be a physical address.

The storage device 100 may perform an operation of writing, reading or erasing data according to a request of the host device. The storage device 100 may include a solid state drive (SSD) or a hard disk drive (HDD). The storage device 100 may include the following memory cards: a personal computer (PC) card (e.g., personal computer memory card international association (PCMCIA)), a compact flash card, a smart media card (SM SMC), a memory stick, a multimedia card (MMC, reduced size (RS)-MMC, MMCmicro), a secure digital (SD) card (SD, miniSD, microSD, secure digital high capacity (SDHC)), a Universal Serial Bus (USB) memory card, and a universal flash storage (UFS). The storage device 100 may include the following embedded memories: embedded MultiMedia Card (eMMC), UFS, and Perfect Page New (PPN).

Figure 23:
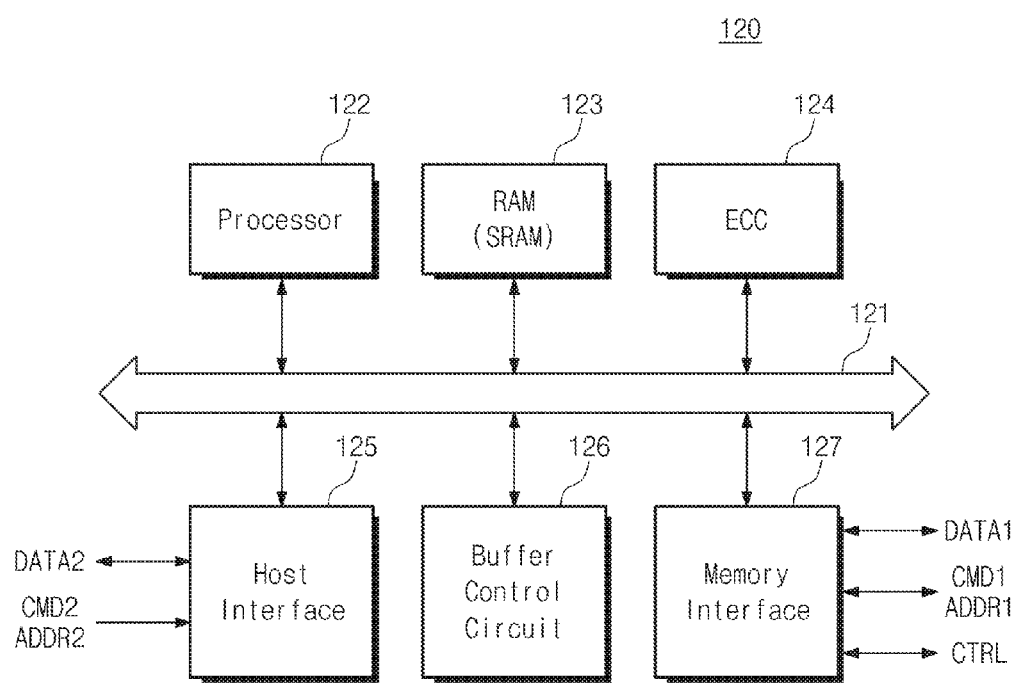
FIG. 23 is a block diagram illustrating a memory controller according to an exemplary embodiment of the inventive concept.

FIG. 23 is a block diagram illustrating a memory controller 120 according to an exemplary embodiment of the inventive concept. Referring to FIG. 23, the memory controller 120 may contain a bus 121, a processor 122, a RAM 123, an ECC block 124, a host interface 125, a buffer control circuit 126, and a memory interface 127.

The bus 121 may be configured to provide a channel among components of the memory controller 120.

The processor 122 may control an overall operation of the memory controller 120 and may execute a logical operation. The processor 122 may communicate with an external host device through the host interface 125. The processor 122 may store, in the RAM 123, a second command CMD2 or a second address ADDR2 received through the host interface 125. The processor 122 may produce a first command CMD1 and a first address ADDR1 according to the second command CMD2 or the second address ADDR2 stored in the RAM 123, and may output the first command CMD1 and the first address ADDR1 through the memory interface 127.

The processor 122 may output second data DATA2 received from the host interface 125 through the buffer control circuit 126 or may store it in the RAM 123. The processor 122 may output, through the memory interface 127, data stored in the RAM 123 or data received through the buffer control circuit 126. The processor 122 may store first data DATA1 received through the memory interface 127 in the RAM 123 or may output it through the buffer control circuit 126. Under a control of the processor 122, data stored in the RAM 123 or data received through the buffer control circuit 126 may be output through the host interface 125 as the second data DATA2 or may be output through the memory interface 127 as the first data DATA1.

The RAM 123 may be used as a working memory, a cache memory, or a buffer memory of the processor 122. The RAM 123 may store codes or instructions that the processor 122 will execute. The RAM 123 may store data processed by the processor 122. The RAM 123 may include an SRAM.

The ECC block 124 performs an error correction operation. The ECC block 124 generates parity for error correction, based on the first data DATA1 to be output to the memory interface 127 or the second data DATA2 received from the host interface 125. The first data DATA1 and parity may be output through the memory interface 127. The ECC block 124 corrects an error of the first data DATA1 using the first data DATA1 and parity that are received through the memory interface 127. The ECC block 124 may be implemented as a component of the memory interface 127.

The host interface 125 may communicate with the external host device 100 according to a control of the processor 122. The host interface 125 may receive the second command CMD2 and the second address ADDR2 from the external host device and may exchange the second data DATA2 with the external host device.

The host interface 125 may communicate using at least one of the following communication techniques: USB, serial advanced technology attachment (SATA), high speed interchip (HSIC), small computer system interface (SCSI), Firewire, peripheral component interconnection (PCI), PCI express (PCIe), nonvolatile memory express (NVMe), UFS, SD, MMC, and eMMC.

The buffer control circuit 126 may be configured to control the RAM 130 (see FIG. 22) in response to a control of the processor 122. The buffer control circuit 126 may write data in the RAM 130 and may read data therefrom.

The memory interface 127 may be configured to communicate with the nonvolatile memory 110 (refer to FIG. 1) in response to a control of the processor 122. The memory interface 127 may send the first command CMD1 and the first address ADDR1 to the nonvolatile memory 110 and may exchange the first data DATA1 and the control signal CTRL with the nonvolatile memory 110.

In an exemplary embodiment of the inventive concept, the storage device 100 (see FIG. 22) may not include the RAM 130. In other words, the storage device 100 may not include a separate memory outside the nonvolatile memory 110 and the memory controller 120. In this case, the memory controller 120 may not include the buffer control circuit 126. A function of the RAM 130 may be performed using the RAM 123 in the memory controller 120.

In an exemplary embodiment of the inventive concept, the processor 122 may control the memory controller 120 using codes. The processor 122 may load codes from a nonvolatile memory (e.g., a read only memory) in the memory controller 120. In an exemplary embodiment of the inventive concept, the processor 122 may load codes received from the memory interface 127.

In an exemplary embodiment of the inventive concept, the bus 121 of the memory controller 120 may be a control bus or a data bus. The data bus may transfer data in the memory controller 120, and the control bus may transfer a command and an address in the memory controller 120. The data bus and the control bus may independent of each other to prevent interference between the data and control buses. This way, the buses may not affect each other. The data bus may be connected to the ECC block 124, the host interface 125, the buffer controller circuit 126, and the memory interface 127. The control bus may be connected to the processor 122, the RAM 123, the host interface 125, the buffer controller circuit 126, and the memory interface 127.

Figure 24:
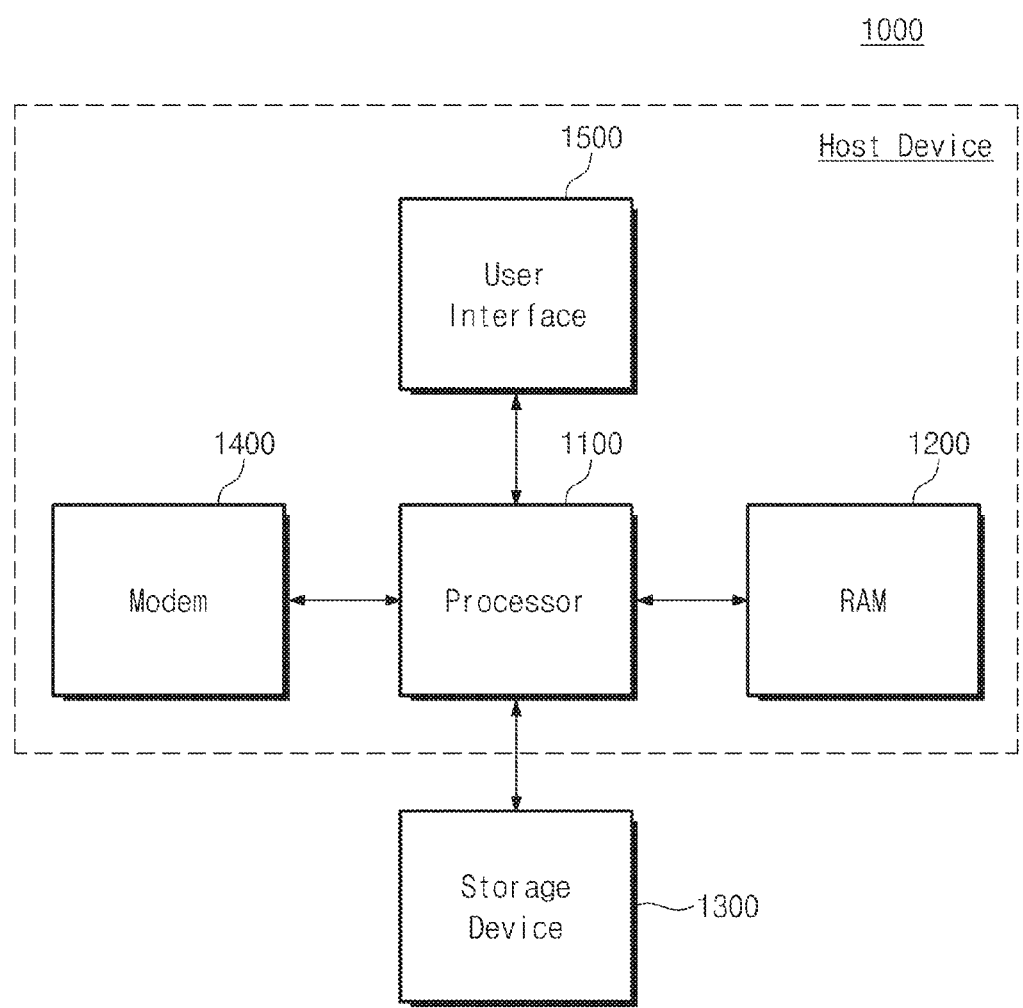
FIG. 24 is a block diagram illustrating a computing device according to an exemplary embodiment of the inventive concept.

FIG. 24 is a block diagram illustrating a computing device 1000 according to an exemplary embodiment of the inventive concept. Referring to FIG. 24, the computing device 1000 may include a processor 1100, a memory 1200, a storage device 1300, a modem 1400, and a user interface 1500.

The processor 1100 may control an overall operation of the computing device 1000 and may perform a logical operation. The processor 1100 may be formed of a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 stores codes or data in the RAM 1200 temporarily. The processor 1100 may execute codes using the RAM 1200 to process data. The processor 1100 may execute a variety of software, such as, but not limited to, an operating system and an application, by means of the RAM 1200. The processor 1100 may control an overall operation of the computing device 1000 by means of the RAM 1200. The RAM 1200 may include a volatile memory such as, but not limited to, an SRAM, a DRAM, and an SDRAM or a nonvolatile memory such as, but not limited to, a PRAM, an MRAM, an RRAM, and an FRAM.

The storage device 1300 may communicate with the processor 1100. The storage device 1300 may be used to store data for a long time. In other words, the processor 1110 may store data, which is to be stored for a long time, in the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In an exemplary embodiment of the inventive concept, the processor 1100 may load source codes stored in the storage device 1300 on the RAM 1200. The codes loaded on the RAM 1200 may be executed to run a variety of software, such as an operating system and an application. The processor 1100 may load data stored in the storage device 1300 on the RAM 1200 and may process data loaded on the RAM 1200.

The processor 1100 may store long-term data of data stored in the RAM 1200 in the storage device 1300.

The storage device 1300 may include a nonvolatile memory, such as, but not limited to, a flash memory, a PRAM, an MRAM, an RRAM, or an FRAM.

The modem 1400 may communicate with an external device in response to a control of the processor 1100. For example, the modem 2400 may communicate with the external device in a wired or wireless manner. The modem 1400 may communicate with the external device, based on at least one of wireless communications techniques such as Long Term Evolution (LTE), worldwide interoperability for microwave access (WiMax), Global System for Mobile communication (GSM), Code Division Multiple Access (CDMA), Bluetooth, Near Field Communication (NFC), wireless fidelity (WiFi), and Radio Frequency Identification (RFID) or wired communications techniques such as USB, SATA, HSIC, SCSI, Firewire, PCI, PCIe, NVMe, UFS, SD, secure digital input output (SDIO), Universal Asynchronous Receiver Transmitter (UART), Serial Peripheral Interface (SPI), High Speed SPI (HS-SPI), RS232, Inter-integrated Circuit (I2C), high speed I2C (HS-I2C), Integrated-interchip Sound (I2S), Sony/Philips Digital Interface (S/PDIF), MMC, and eMMC.

The user interface 1500 may communicate with a user under a control of the processor 1100. For example, the user interface 1500 may include user input interfaces such as a keyboard, a keypad, a button, a touch panel, a touch screen, a touch pad, a touch ball, a camera, a microphone, a gyroscope sensor, and a vibration sensor. The user interface 1500 may further include user output interfaces such as a liquid crystal display (LCD), an Organic Light Emitting Diode (OLED) display device, an Active Matrix OLED (AMOLED) display device, an LED, a speaker, and a motor.

The storage device 1300 may include the storage device 100 (see FIG. 22) according to an exemplary embodiment of the inventive concept. The processor 1100, the RAM 1200, the modem 1400, and the user interface 1500 may constitute a host device that communicates with the storage device 1300.

According to an exemplary embodiment of the inventive concept, in a program recovery operation, a voltage of a selected word line may be maintained to be higher than that of an unselected word line(s) during a specific time. Accordingly, data programmed in memory cells can be more reliable.

While the inventive concept has been described with reference to exemplary embodiments thereof, it will be apparent to those skilled in the art that various changes and modifications may be made thereto without departing from the scope of the inventive concept as defined by the following claims.

What is claimed is:

1. A method of programming a nonvolatile memory device, comprising:
applying a first voltage to a first wordline of the nonvolatile memory device, wherein the first wordline is connected to a first memory cell; and
applying a second voltage to a second wordline of the nonvolatile memory device, wherein the second voltage is greater than the first voltage, wherein the second wordline is connected to a second memory cell;
decreasing the first voltage;
decreasing the second voltage, wherein a difference between the first voltage and the second voltage is maintained for a predetermined time; and
discharging the second voltage.

2. The method of claim 1, wherein the first voltage is a pass voltage and the second voltage is a program voltage.

3. The method of claim 2, wherein the first wordline is an unselected wordline, and the second wordline is a selected wordline.

4. The method of claim 1, Wherein the first voltage starts being decreased after the second voltage starts being decreased.

5. The method of claim 1, wherein the second voltage stops being decreased before the first voltage starts being decreased.

6. The method of claim 1, wherein decreasing the second voltage comprises decreasing the second voltage to a first level, and then, decreasing the second voltage to a second level lower than the first level.

7. The method of claim 1, wherein decreasing the first voltage comprises decreasing the first voltage to a first level, and then, decreasing the first voltage to a second level lower than the first level.

8. The method of claim 1, Wherein a program operation comprises the steps of applying the first voltage, applying the second voltage, decreasing the first voltage, decreasing the second voltage and discharging the second voltage, the method further comprising:
 performing a verification operation of the program operation;
 determining whether the verification operation passes or fails; and
 repeating the program operation when the verification operation fails,
 wherein, in repeating the program operation, the difference between the first voltage and the second voltage is changed, or
 wherein, in repeating the program operation, the predetermined time is changed.

9. The method of claim 8, wherein, in repeating the program operation, the difference between the first voltage and the second voltage is increased, or
 wherein, in repeating the program operation, the predetermined time is increased.

10. The method of claim 1, wherein a program operation comprises the steps of applying the first voltage, applying the second voltage, decreasing the first voltage, decreasing the second voltage and discharging the second voltage, wherein the program operation is performed after a target program state of a plurality of program states is program passed.

11. The method of claim 1, wherein the difference between the first voltage and the second voltage depends on a location of the second wordline in a cell string, or
 wherein the predetermined time depends on the location of the second wordline in the cell string.

12. The method of claim 1, wherein the difference between the first voltage and the second voltage depends on a wordline group in which the second wordline is located in a cell string, or
 wherein the predetermined time depends on the wordline group in which the second wordline is located in the cell string.

13. The method of claim 1, wherein the nonvolatile memory device includes a cell string, the cell string including a plurality of memory cells, a first memory cell being connected to the first wordline and receiving the first voltage, a second memory cell being connected to the second wordline and receiving the second voltage.

14. The method of claim 13, wherein the first and second memory cells are charge trap cells.

15. A method of programming a nonvolatile memory device, comprising:
 applying a first voltage to a first wordline of the nonvolatile memory device, wherein the first wordline is connected to a first memory cell; and
 applying a second voltage to a second wordline of the nonvolatile memory device, wherein the second voltage is greater than the first voltage, wherein the second wordline is connected to a second memory cell;
 decreasing the first voltage;
 decreasing the second voltage, wherein the second voltage is higher than the first voltage for a predetermined time; and
 discharging the second voltage after the predetermined time.

16. The method of claim 15, wherein the first voltage is a pass voltage, and the second voltage is a program voltage.

17. The method of claim 15, wherein the predetermined time is about 10 µs.

18. The method of claim 15, wherein the nonvolatile memory device includes a cell string, the cell string including a plurality of memory cells, a first memory cell being connected to the first wordline and receiving the first voltage, a second memory cell being connected to the second wordline and receiving the second voltage.

19. The method of claim 18, wherein the first and second memory cells are charge trap cells.

20. A method for programming a NAND flash memory including a memory cell array, the memory cell array including a plurality of memory blocks, each block including a plurality of cell strings, each cell sting including a ground selection transistor, a plurality of cell transistors, and a string selection transistor sequentially stacked in a direction perpendicular to a surface of a substrate on which the cell string is disposed, the method comprising:
 applying a first voltage to a first wordline of a cell string, Wherein the first voltage has a first level, wherein the first wordline is connected to a first memory cell;
 applying a second voltage to a second wordline of the cell string, wherein the second voltage has a second level, wherein the second level is greater than the first level, wherein the second wordline is connected to a second memory cell;
 decreasing the first voltage to a third level, wherein the third level is less than the first level;
 decreasing the second voltage to a fourth level, Wherein the fourth level is less than the second level and greater than the third level, wherein a difference between the third level and the fourth level is constant for a predetermined time; and
 discharging the second voltage to the third level.

21. The method of claim 20, wherein the cell transistors are charge trap transistors.

22. The method of claim 20, wherein the first voltage is a pass voltage, and the second voltage is a program voltage.

23. The method of claim 20, wherein the third level has a range from 0V to 1.5V.

24. The method of claim 20, further comprising:
 applying a select voltage to a bitline of the cell string.

* * * * *